United States Patent
Ogura et al.

(10) Patent No.: US 10,486,398 B2
(45) Date of Patent: Nov. 26, 2019

(54) CONDUCTOR-LAYER-EQUIPPED STRUCTURE AND TOUCH PANEL

(71) Applicant: FUJIKURA LTD., Tokyo (JP)

(72) Inventors: Shingo Ogura, Chiba (JP); Takaharu Hondo, Chiba (JP); Takeshi Shiojiri, Chiba (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 15/575,623

(22) PCT Filed: May 17, 2016

(86) PCT No.: PCT/JP2016/064654
§ 371 (c)(1),
(2) Date: Nov. 20, 2017

(87) PCT Pub. No.: WO2016/186117
PCT Pub. Date: Nov. 24, 2016

(65) Prior Publication Data
US 2018/0154616 A1   Jun. 7, 2018

(30) Foreign Application Priority Data

May 20, 2015   (JP) .................................. 2015-103090
Feb. 3, 2016   (JP) .................................. 2016-018726

(51) Int. Cl.
*G06F 1/00*        (2006.01)
*B32B 27/08*       (2006.01)
(Continued)

(52) U.S. Cl.
CPC ................ *B32B 27/08* (2013.01); *B32B 7/02* (2013.01); *G06F 3/044* (2013.01); *H01B 5/14* (2013.01);
(Continued)

(58) Field of Classification Search
CPC ......... G06F 3/044; G06F 3/041; B32B 27/08; G02B 1/04
See application file for complete search history.

(56) References Cited

U.S. PATENT DOCUMENTS 7,268,770 B1 *  9/2007  Takahata ............. G02F 1/13338
                                                   345/173
2008/0135283 A1  6/2008  Hibino et al.
(Continued)

FOREIGN PATENT DOCUMENTS

JP     2006-302930 A   11/2006
JP     2009-192922 A   8/2009
(Continued)

OTHER PUBLICATIONS

English translation of Office Action issued in corresponding Taiwanese Application No. 105115284 (cited on Nov. 20, 2017) dated Aug. 3, 2017 (8 pages).
(Continued)

*Primary Examiner* — Michael A Faragalla
(74) *Attorney, Agent, or Firm* — Osha Liang LLP

(57) ABSTRACT

A conductor-layer-equipped structure includes: a wiring body that includes a first resin layer, a first conductor layer provided on the first resin layer, and a second resin layer provided on the first resin layer so as to cover the first conductor layer; a cover glass that is in direct contact with one main surface of the wiring body or adheres to the one main surface of the wiring body via a first adhesion layer; and a liquid crystal panel that is in direct contact with the another main surface of the wiring body or adheres to the another main surface of the wiring body via a second adhesion layer. The first resin layer includes a material having optical isotropy. The second resin layer includes a material having optical isotropy. The material of the first
(Continued)

resin layer and the material of the second resin layer have the same composition.

18 Claims, 12 Drawing Sheets

(51) Int. Cl.
| | |
|---|---|
| *B32B 7/02* | (2019.01) |
| *G06F 3/044* | (2006.01) |
| *H01B 5/14* | (2006.01) |
| *H01B 13/00* | (2006.01) |
| *H01B 7/02* | (2006.01) |
| *H03K 17/96* | (2006.01) |
| *G02F 1/1333* | (2006.01) |

(52) U.S. Cl.
CPC .............. *H01B 7/02* (2013.01); *H01B 13/00* (2013.01); *H03K 17/962* (2013.01); *B32B 2307/202* (2013.01); *B32B 2457/208* (2013.01); *G02F 1/13338* (2013.01); *G06F 2203/04103* (2013.01); *G06F 2203/04111* (2013.01); *G06F 2203/04112* (2013.01); *H01B 13/0036* (2013.01)

(56) References Cited

U.S. PATENT DOCUMENTS

| | | | | |
|---|---|---|---|---|
| 2010/0230154 | A1* | 9/2010 | Naito | B41M 3/006 |
| | | | | 174/389 |
| 2014/0248465 | A1* | 9/2014 | Kunikata | C09K 3/16 |
| | | | | 428/141 |
| 2015/0116264 | A1 | 4/2015 | Ookawa et al. | |
| 2015/0118455 | A1 | 4/2015 | Ookawa et al. | |
| 2015/0301667 | A1* | 10/2015 | Yano | G06F 3/0412 |
| | | | | 345/173 |
| 2016/0209549 | A1 | 7/2016 | Ookawa et al. | |

FOREIGN PATENT DOCUMENTS

| | | |
|---|---|---|
| JP | 2012-018590 A | 1/2012 |
| JP | 2013-020530 A | 1/2013 |
| JP | 2013-045261 A | 3/2013 |
| JP | 2013-142941 A | 7/2013 |
| JP | 2013-257855 A | 12/2013 |
| JP | 2014-191717 A | 10/2014 |
| JP | 2014-191726 A | 10/2014 |
| JP | 2014-213546 A | 11/2014 |
| JP | 2015-074147 A | 4/2015 |
| JP | 2015-099748 A | 5/2015 |
| TW | 201501139 A | 1/2015 |
| TW | 2015-17068 A | 5/2015 |

OTHER PUBLICATIONS

Decision of Refusal in counterpart Japanese Patent Applicatioon No. 2017-519373 issued on May 15, 2018 (7 pages).
Office Action issued in Japanese application No. 2016-018726 dated May 10, 2016 (4 pages).
Office Action issued in Taiwanese application No. 105115284 dated Aug. 3, 2017 (7 pages).
Office Action issued in Japanese application No. 2017-519373 dated Oct. 3, 2017 (4 pages).
Extended European Search Report issued in corresponding European Patent Application 16796510.2 dated Oct. 10, 2018 (12 pages).

* cited by examiner

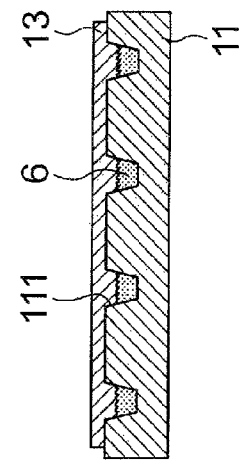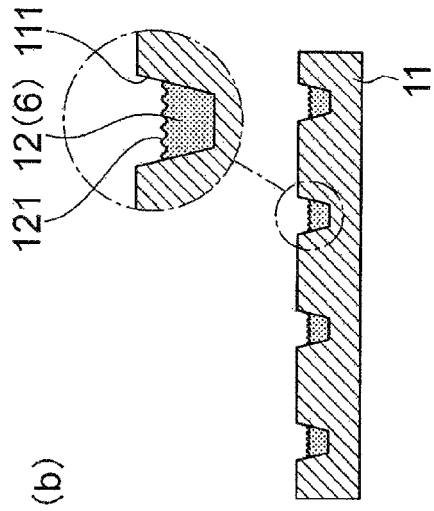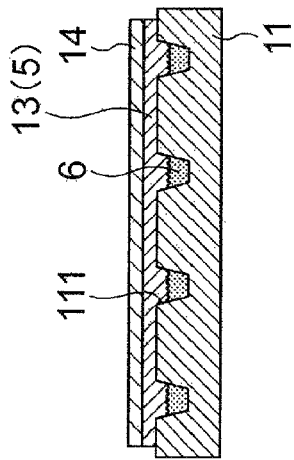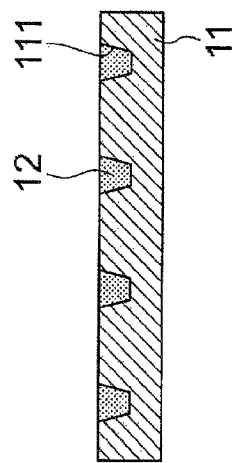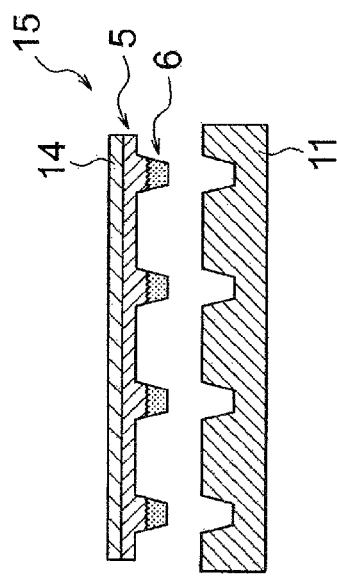
Fig.8(a)　Fig.8(b)　Fig.8(c)
Fig.8(d)　Fig.8(e)

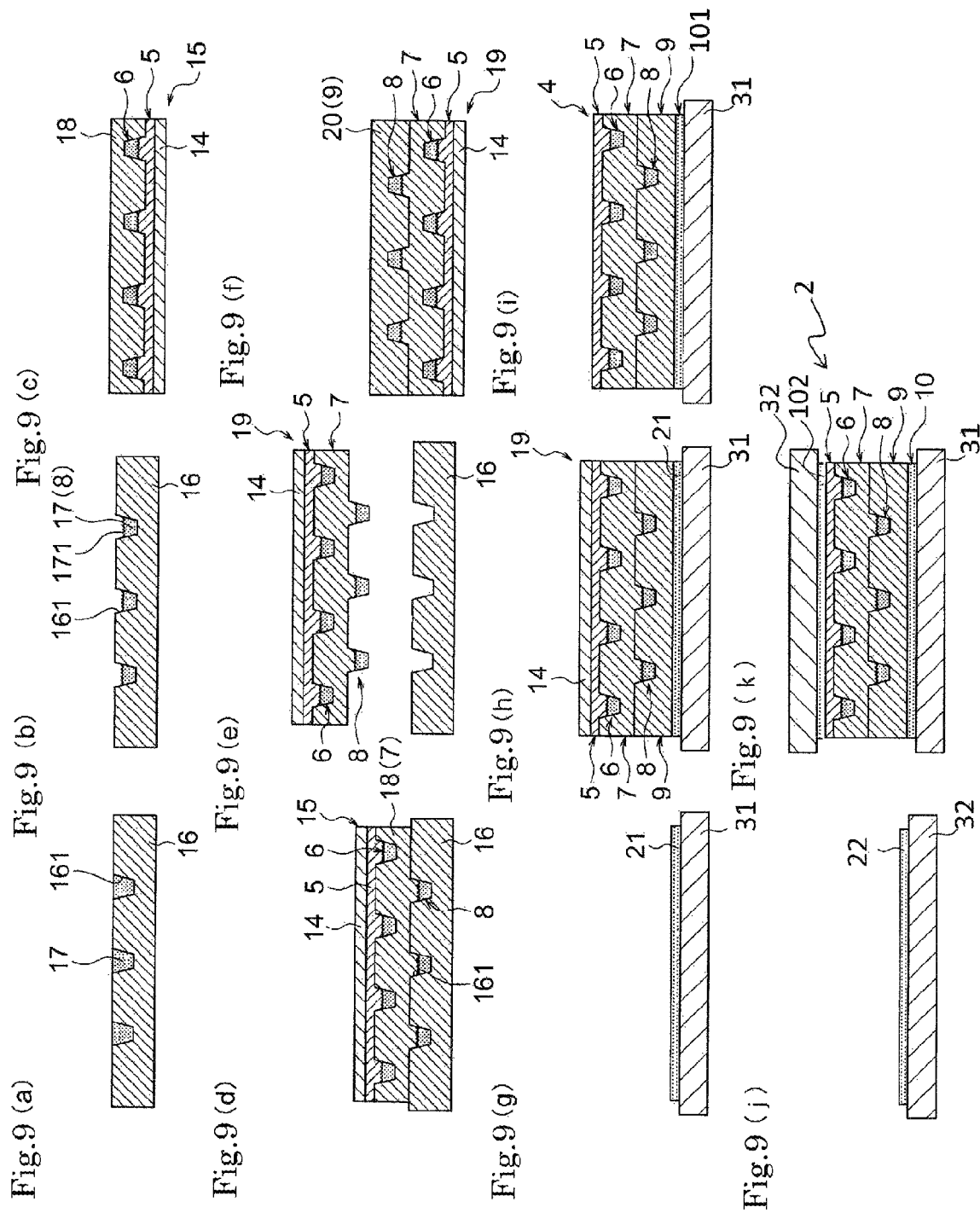

CONDUCTOR-LAYER-EQUIPPED STRUCTURE AND TOUCH PANEL

TECHNICAL FIELD

The present invention relates to a conductor-layer-equipped structure and a touch panel.

The contents of Patent Application No. 2015-103090, filed with Japan Patent Office on May 20, 2015, and Patent Application No. 2016-18726, filed with Japan Patent Office on Feb. 3, 2016, are incorporated herein by reference in the designated countries in which the incorporation by reference is accepted.

BACKGROUND

A sensor film for touch panels is known which is configured such that a conductor pattern layer is laid on a transparent board having a retardation of 6,000 nm or more (see Patent Document 1, for example).

PATENT DOCUMENTS

[Patent Document 1] JP2013-257855A
[Patent Document 2] JP2014-191717A
[Patent Document 3] JP2014-191726A
[Patent Document 4] JP2015-074147A
[Patent Document 5] JP2006-302930A

SUMMARY

To suppress the deterioration in visibility, the above sensor film uses a transparent board having a retardation value of 6,000 nm or more, that is, having optical anisotropy. However, this may lead to increase in the production cost because a transparent board having a large retardation value is an expensive material.

One or more embodiments of the present invention provide a conductor-layer-equipped structure and touch panel that are capable of suppressing the deterioration in visibility while reducing the cost.

<1> The conductor-layer-equipped structure according to one or more embodiments of the present invention comprises: a wiring body including a first resin layer; a first conductor layer provided on the first resin layer; and a second resin layer provided on the first resin layer so as to cover the first conductor layer; a support body being in direct contact with one main surface of the wiring body or adheres to the one main surface of the wiring body via a first adhesion layer; and a board being in direct contact with the other main surface of the wiring body or adheres to the other main surface of the wiring body via a second adhesion layer. The first resin layer is composed of a material having optical isotropy. The second resin layer is composed of a material having optical isotropy. The material of which the first resin layer is composed and the material of which the second resin layer is composed have the same composition.

<2> In another aspect, the conductor-layer-equipped structure according to one or more embodiments of the present invention comprises: a wiring body including a first resin layer; a first conductor layer provided on the first resin layer; a second resin layer provided on the first resin layer so as to cover the first conductor layer; and a support body being in direct contact with one main surface of the wiring body or adheres to the one main surface of the wiring body via a first adhesion layer. The other main surface of the wiring body is exposed to external. The first resin layer is composed of a material having optical isotropy. The second resin layer is composed of a material having optical isotropy. The material of which the first resin layer is composed and the material of which the second resin layer is composed have the same composition.

<3> In one or more embodiments, a following Expressions (1) and (2) may be satisfied:

$$1.45 \leq N_1 \leq 1.55 \tag{1}$$

and $$1.45 \leq N_2 \leq 1.55 \tag{2}.$$

In the above Expressions (1) and (2), $N_1$ represents a refractive index of the material of which the first resin layer is composed and $N_2$ represents a refractive index of the material of which the second resin layer is composed.

<4> In one or more embodiments, following Expressions (3) and (4) may be satisfied:

$$97\% \leq T_1 \tag{3}$$

and $$97\% \leq T_2 \tag{4}.$$

In the above Expression (3) and (4), $T_1$ represents a total light (luminous) transmittance of the material of which the first resin layer is composed and $T_2$ represents a total light transmittance of the material of which the second resin layer is composed.

<5> In one or more embodiments, a following Expression (5) may be satisfied:

$$0.1\ \mu m \leq H_1 \leq 50\ \mu m \tag{5}.$$

In the above Expression (5), $H_1$ represents a height of the first resin layer.

<6> In one or more embodiments, the first conductor layer may be composed of a first conductor line, the first conductor line may include a first surface that is located at the first resin layer side, a second surface that faces the first surface, and two side surfaces that incline so as to come close to each other in a transverse cross-section of the first conductor line as departing from the first resin layer, and the surface roughness of the first surface may be rougher than the surface roughness of the second surface.

<7> In one or more embodiments, the wiring body may further comprise a second conductor layer provided on the second resin layer so as to face the first conductor layer via the second resin layer.

<8> In one or more embodiments, Expression (6)may be satisfied:

$$H_2 > H_1 \tag{6}.$$

In the above Expression (6), $H_1$ represents a height of the first resin layer and $H_2$ represents a height of the second resin layer.

<9> In one or more embodiments, the wiring body may further comprise a third resin layer provided on the second resin layer so as to cover the second conductor layer and a material of which the third resin layer is composed may have the same composition as compositions of the materials of which the first and second resin layers are composed.

<10> In one or more embodiments, the first adhesion layer may be located at the second resin layer side with respect to the first resin layer.

<11> In another aspect, the touch panel according to one or more embodiments of the present invention comprises the above conductor-layer-equipped structure.

According to one or more embodiments of the present invention, the first resin layer and the second resin layer are composed of materials having optical isotropy. The birefringence for light incident on the wiring body is therefore suppressed. Moreover, the material constituting the first resin layer and the material constituting the second resin layer have the same composition. The occurrence of scattering or the like of the incident light is therefore suppressed at the interface between the first and second resin layers. This can suppress the deterioration in visibility of the conductor-layer-equipped structure.

Furthermore, according to one or more embodiments of the present invention, the cost can be reduced because it is not necessary to use an expensive material having optical anisotropy and thus having a high retardation value. In addition, the first conductor layer is supported by the first resin layer. It is therefore not necessary to use a base material or the like that is provided to directly adhere to the wiring body for supporting the first conductor layer. Thus, the deterioration in visibility of the conductor-layer-equipped structure can be suppressed and the conductor-layer-equipped structure can be made thin.

BRIEF DESCRIPTION OF DRAWINGS

FIG. 8(a) to FIG. 8(e) are cross-sectional views illustrating a method (part 1) of manufacturing a conductor-layer-equipped structure according to one or more embodiments of the present invention.

FIG. 9(a) to FIG. 9(k) are cross-sectional views illustrating a method (part 2) of manufacturing a conductor-layer-equipped structure according to one or more embodiments of the present invention.

DETAILED DESCRIPTION

Hereinafter, embodiments of the present invention will be described with reference to the drawings.

Figure 1:
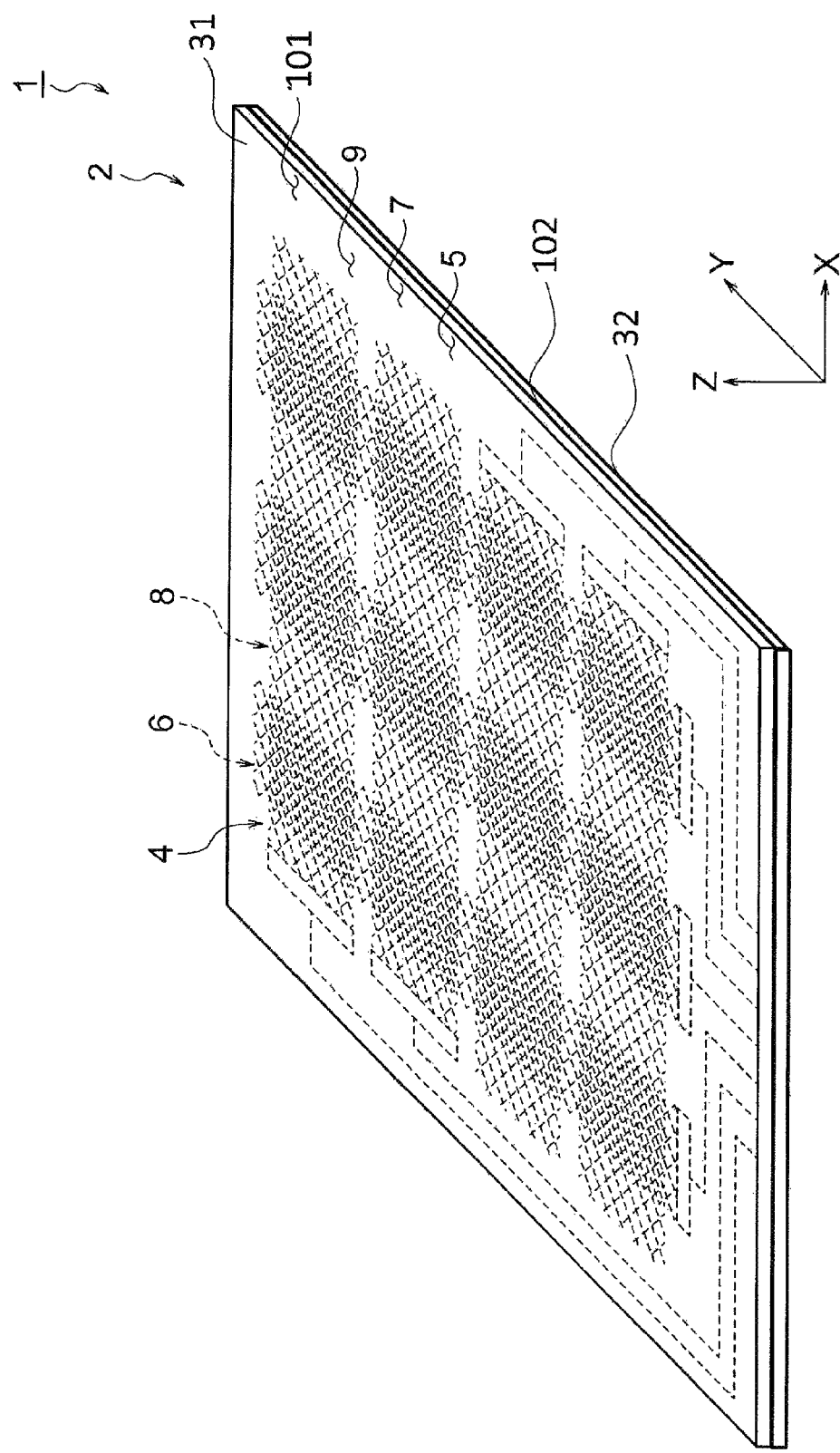
FIG. 1 is a transparent perspective view illustrating an input device according to one or more embodiments of the present invention.

FIG. 1 is a transparent perspective view illustrating an input device according to one or more embodiments of the present invention.

The input device 1 according to one or more embodiments has a function of detecting the operation position of an operator (position detection function) using a capacitance scheme and, as illustrated in FIG. 1, includes a conductor-layer-equipped structure 2.

First, the configuration of the input device 1 according to one or more embodiments will be described in brief.

An image display device (not illustrated) is disposed at one side of the conductor-layer-equipped structure 2. The image display device is, for example, a liquid crystal display (LCD) and has a pair of polarization plates and a liquid crystal panel disposed between the polarization plates. In addition, a color filter is disposed at one side of the liquid crystal panel and a backlight is disposed at the other side. A known configuration of the backlight, such as an edge-lit-type and direct-lit-type, can be employed.

In the image display device of one or more embodiments, the backlight illuminates the back side of the liquid crystal display in a planar fashion and the liquid crystal panel selectively transmits light from the backlight through each pixel. The light transmitting through the liquid crystal panel displays various icons for operation, textual information in response to the operation command input by an operator, and other information on the display part of the image display device.

The conductor-layer-equipped structure 2 includes a wiring body 4. The wiring body 4 comprises two sets of mesh-like electrode layers 61 and 81 (described below). The configuration of the wiring body 4 will be described later in detail.

The first mesh-like electrode layers 61 are a plurality of detection electrodes (three detection electrodes in one or more embodiments) that extend in the Y-direction. The second mesh-like electrode layers 81, arranged to overlap the first mesh-like electrode layers 61 in the plan view, are a plurality of detection electrodes (four detection electrodes in one or more embodiments) that extend in the X-direction. The first and second mesh-like electrode layers 61 and 81 are formed at locations corresponding to the display part of the image display device.

In the input device 1, the first mesh-like electrode layers 61 are connected to an external circuit via lead wires 66 and the second mesh-like electrode layers 81 are connected to the external circuit via lead wires 86. A predetermined voltage is periodically applied between the first and second mesh-like electrode layers 61 and 81.

Some information is displayed on the image display device and the operator operates the input device 1 in accordance with the information. When the operator touches the input device 1, the capacitance varies at intersections of the two sets of mesh-like electrode layers 61 and 81. The input device 1 according to one or more embodiments detects the operator's operation position (touch position) in the input device 1 on the basis of the variation of the capacitance.

The input device 1 has a configuration in which the liquid crystal display (liquid crystal panel) is incorporated as an image display panel, but the present invention is not particularly limited to this. For example, various image display panels, such as a plasma display panel (PDP), electroluminescence display (ELD) panel, cathode-ray tube (CRT) display device, and surface-conduction electron-emitter display (SED) panel, can be used as substitute for the liquid crystal display (liquid crystal panel).

In the above, the input device having a liquid crystal panel is described, but the present invention is not particularly limited to this. For example, it suffices that the input device has at least a portion that can be visually recognized for input. The input device may not have a liquid crystal panel, for example, and may be a touch switch or the like that includes a transparent cover case, on which image information such as numerical characters is printed, and functions as a switch when the image information is touched.

Figure 2:
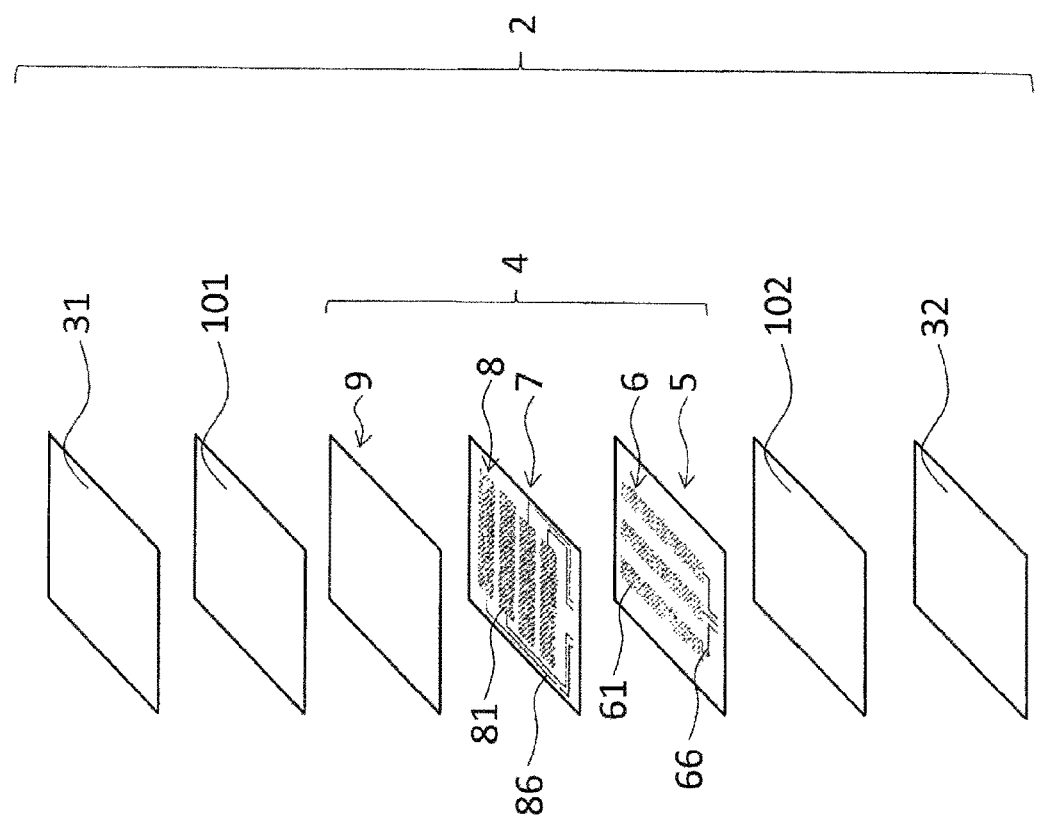
FIG. 2 is an exploded perspective view illustrating a conductor-layer-equipped structure according to one or more embodiments of the present invention.
Figure 3:
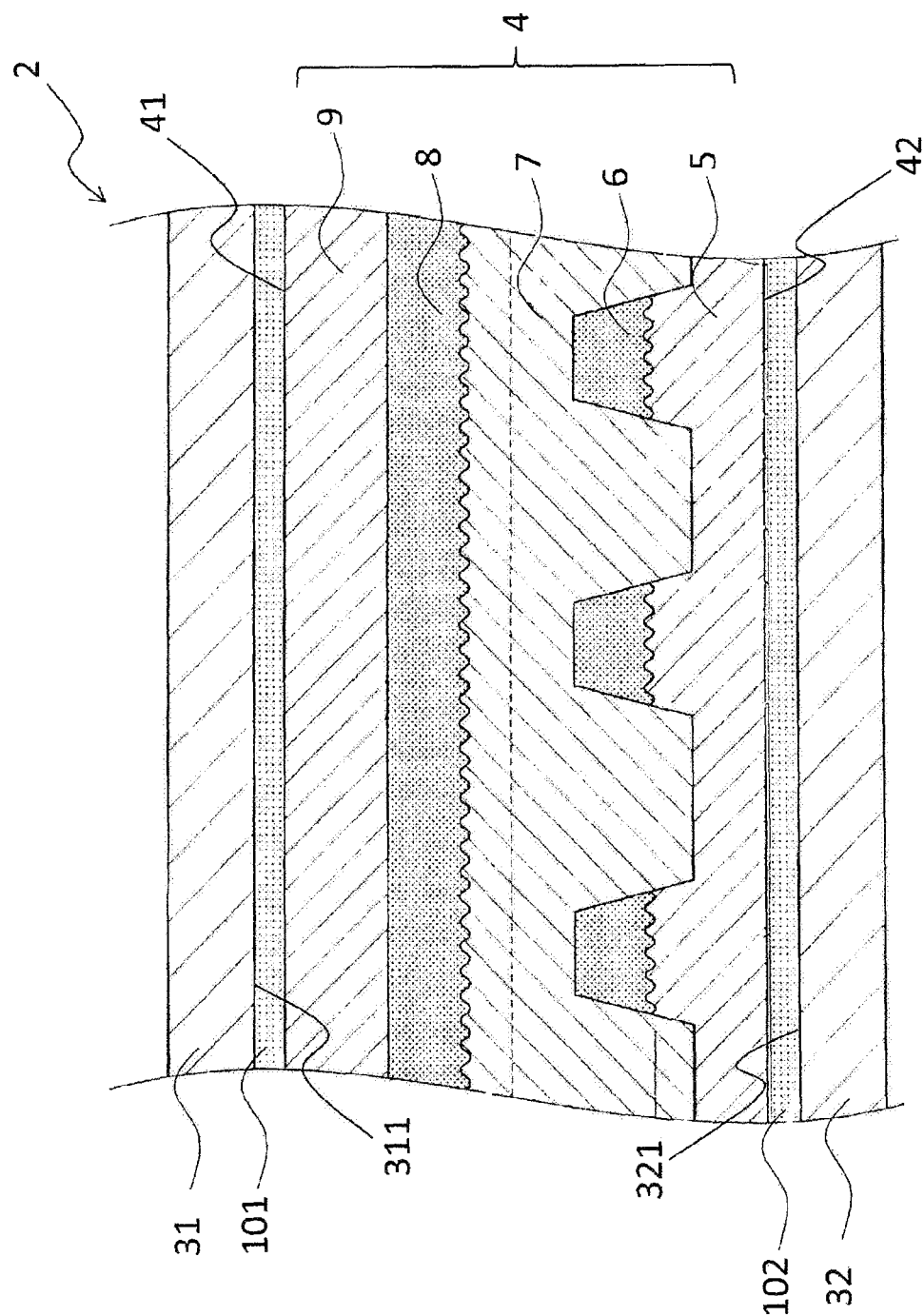
FIG. 3 is a cross-sectional view illustrating a conductor-layer-equipped structure according to one or more embodiments of the present invention.

The conductor-layer-equipped structure 2 will then be described in detail with reference to FIG. 2 and FIG. 3. FIG. 2 is an exploded perspective view illustrating a conductor-layer-equipped structure according to one or more embodiments of the present invention and FIG. 3 is a cross-sectional view illustrating a conductor-layer-equipped structure according to one or more embodiments of the present invention.

The conductor-layer-equipped structure 2 comprises a cover glass 31, a liquid crystal panel 32, the wiring body 4, a first adhesion layer 101, and a second adhesion layer 102. The "conductor-layer-equipped structure 2" in one or more embodiments corresponds to an example of the "conductor-layer-equipped structure" and "touch panel".

As illustrated in FIG. 1, the cover glass 31 is a protection layer that protects components, such as the wiring body 4 and image display device, in the input device 1 from external. Such a cover glass 31 may be, for example, but is not limited to being, composed of appropriate glass, such as soda-lime glass and borosilicate glass.

In one or more embodiments, the cover glass 31 may be substituted by a transparent resin, such as polymethylmethacrylate (PMMA), which is used as a protection layer that protects the wiring body 4 and the image display device from external.

The cover glass 31 is a plate-like member having a uniform thickness. The cover glass 31 has a main surface 311 that is formed to be substantially flat.

The cover glass 31 is provided at the side of one main surface 41 of the wiring body 4 via the first adhesion layer 101. The cover glass 31 covers the entire main surface 41 of the wiring body 4, so that the main surface 41 of the wiring body 4 is not exposed to external.

As illustrated in FIG. 2 and FIG. 3, the first adhesion layer 101 is used to attach the wiring body 4 to the cover glass 31. A known adhesive, such as an acrylic resin-based adhesive, urethane resin-based adhesive, and polyester resin-based adhesive, can be used for the first adhesion layer 101. From the viewpoint of suppressing the deterioration in visibility of the wiring body 4, a material having a refractive index of 1.47 or more and 1.52 or less as the material which constitutes the first adhesion layer 101 may be used.

This can reduce the difference between the refractive index of the material which constitutes the cover glass 31 and the refractive index of the material which constitutes the first adhesion layer 101. At the interface between the cover glass 31 and the first adhesion layer 101, therefore, the occurrence of scattering or the like of light incident on the conductor-layer-equipped structure 2 can be suppressed.

The first adhesion layer 101 is interposed between the cover glass 31 and the wiring body 4. The first adhesion layer 101 adheres directly to the main surface 311 of the cover glass 31 and also adheres directly to the main surface 41 of the wiring body 4 (specifically, a third resin layer 9). Only the first adhesion layer 101 is interposed between the cover glass 31 and the wiring body 4 and other configuration, such as a base material, is not interposed therebetween.

The cover glass 31 and the first adhesion layer 101 are located at the side of a second resin layer 7 with respect to a first resin layer 5. In this case, relatively smooth surfaces of outer shapes of first and second conductor lines 62 and 82 that constitute the first and second mesh-like electrode layers 61 and 81 are arranged to face the cover glass 31 side. This can suppress the occurrence of scattering or the like of incident light from the cover glass 31 side. Details will be described later.

The "first adhesion layer 101" in one or more embodiments corresponds to an example of the "first adhesion layer".

The liquid crystal panel 32 is a plate-like member that constitutes the image display device incorporated in the input device 1. The liquid crystal panel 32 is provided at the other main surface 42 side of the wiring body 4 via the second adhesion layer 102. The liquid crystal panel 32 covers the main surface 42 of the wiring body 4, so that the main surface 42 of the wiring body 4 is not exposed to external.

As illustrated in FIG. 2 and FIG. 3, the second adhesion layer 102 is used to attach the liquid crystal panel 32 to the wiring body 4. The same adhesive as used for the above-described first adhesion layer 101 can be used for the second adhesion layer 102.

The second adhesion layer 102 is interposed between the liquid crystal panel 32 and the wiring body 4. The second adhesion layer 102 adheres directly to a main surface 321 of the liquid crystal panel 32 and also adheres directly to the main surface 42 of the wiring body 4 (specifically, the first resin layer 5). Only the second adhesion layer 102 is interposed between the liquid crystal panel 32 and the wiring body 4 and other configuration, such as a base material, is not interposed therebetween. The "second adhesion layer 102" in one or more embodiments corresponds to an example of the "second adhesion layer".

The wiring body 4 is supported by at least one of the cover glass 31 and the liquid crystal panel 32. In one or more embodiments, one of the cover glass 31 and the liquid crystal panel 32 is constituted as a support body while the other is constituted as a board. When both the cover glass 31 and the liquid crystal panel 32 adhere to the wiring body 4 via the adhesion layers, either the cover glass 31 or the liquid crystal panel 32 which adheres to the wiring body 4 via an adhesion layer having larger adhesion strength of the first adhesion layer 101 and the second adhesion layer 102 constitutes the support body. The "cover glass 31" in one or more embodiments corresponds to an example of one of the "support body" and "board" and the "liquid crystal panel 32" in one or more embodiment corresponds to an example of the other of the "support body" and "board."

In the above, at least one of the cover glass 31 and the liquid crystal panel 32 is used as the support body, but the present invention is not limited to this, and any component, such as a polarization plate and a color filter, which constitutes the image display device may be used as the support body. When the input device 1 has a hard coat layer, antistatic layer, antidazzle layer, antifouling layer, antireflection layer, high-dielectric layer, and/or electromagnetic shielding layer, any of these may be used as the support body. When the input device 1 includes an appropriate structure, such as a printed board, heat dissipating plate, and housing, any of these may be used as the support body. That is, the configuration of the support body is not particularly limited, provided that the support body can support the wiring body 4.

Figure 4:
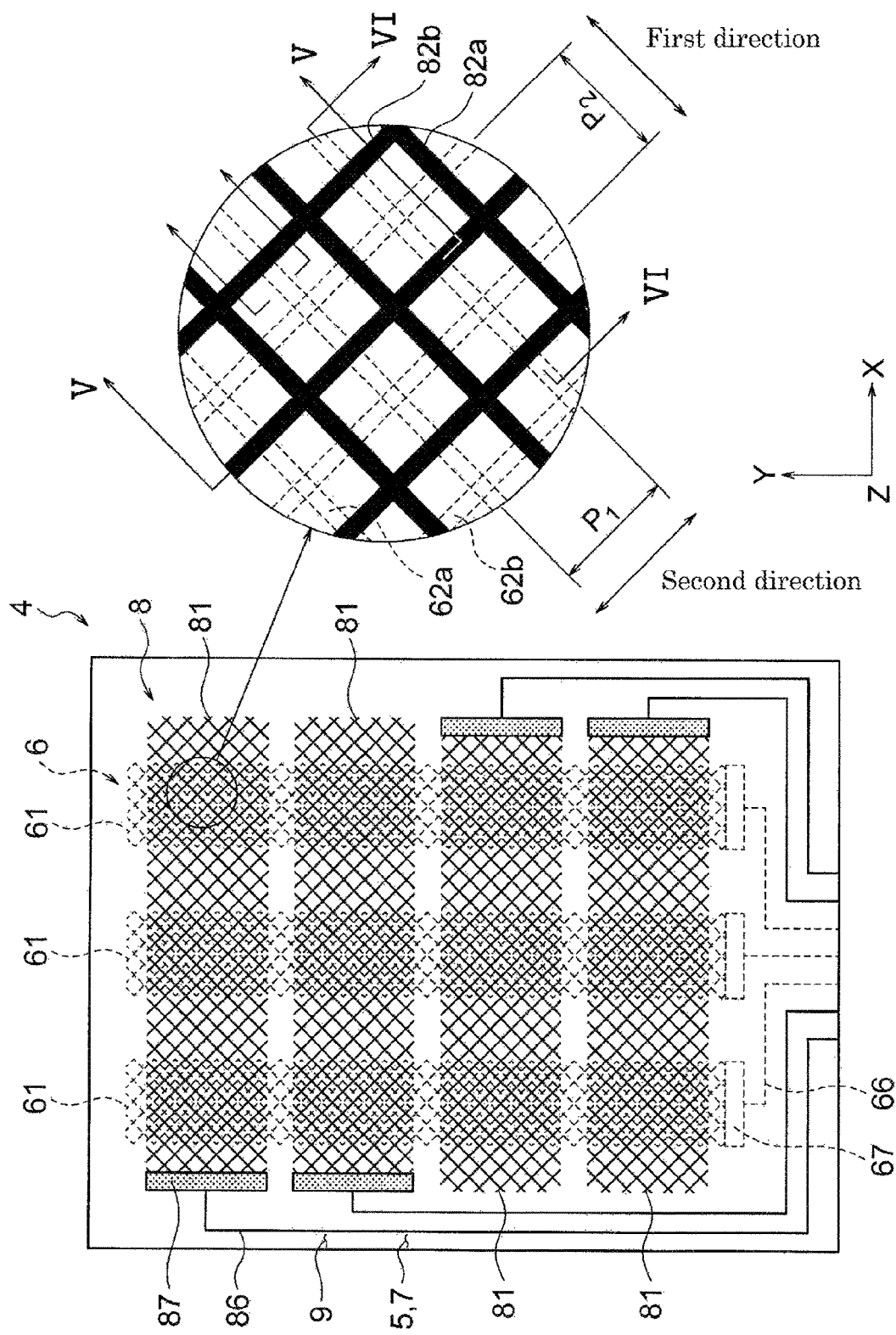
FIG. 4 is a transparent plan view illustrating a wiring body according to one or more embodiments of the present invention.
Figure 5:
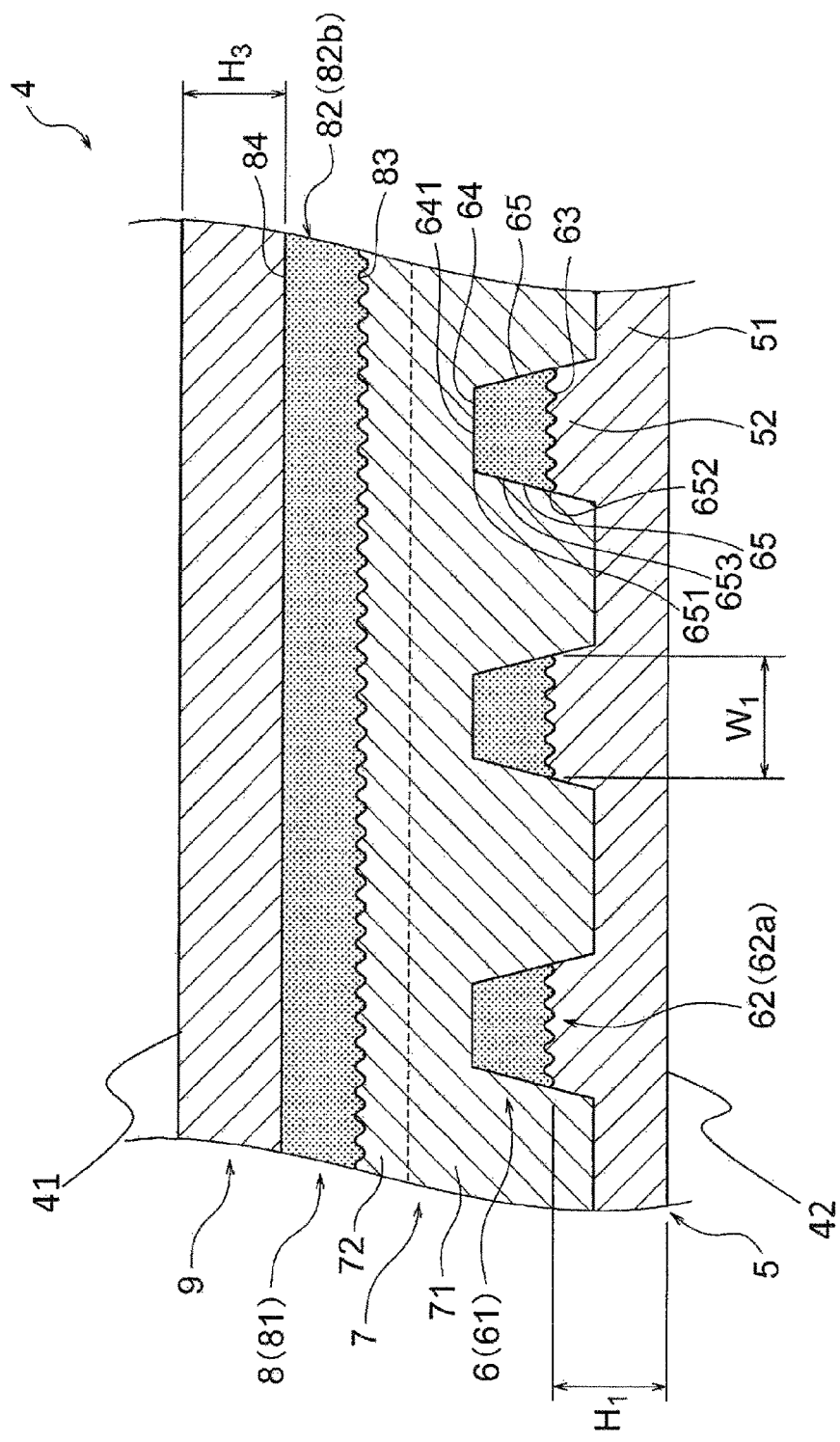
FIG. 5 is a cross-sectional view along line V-V of FIG. 4.
Figure 6:
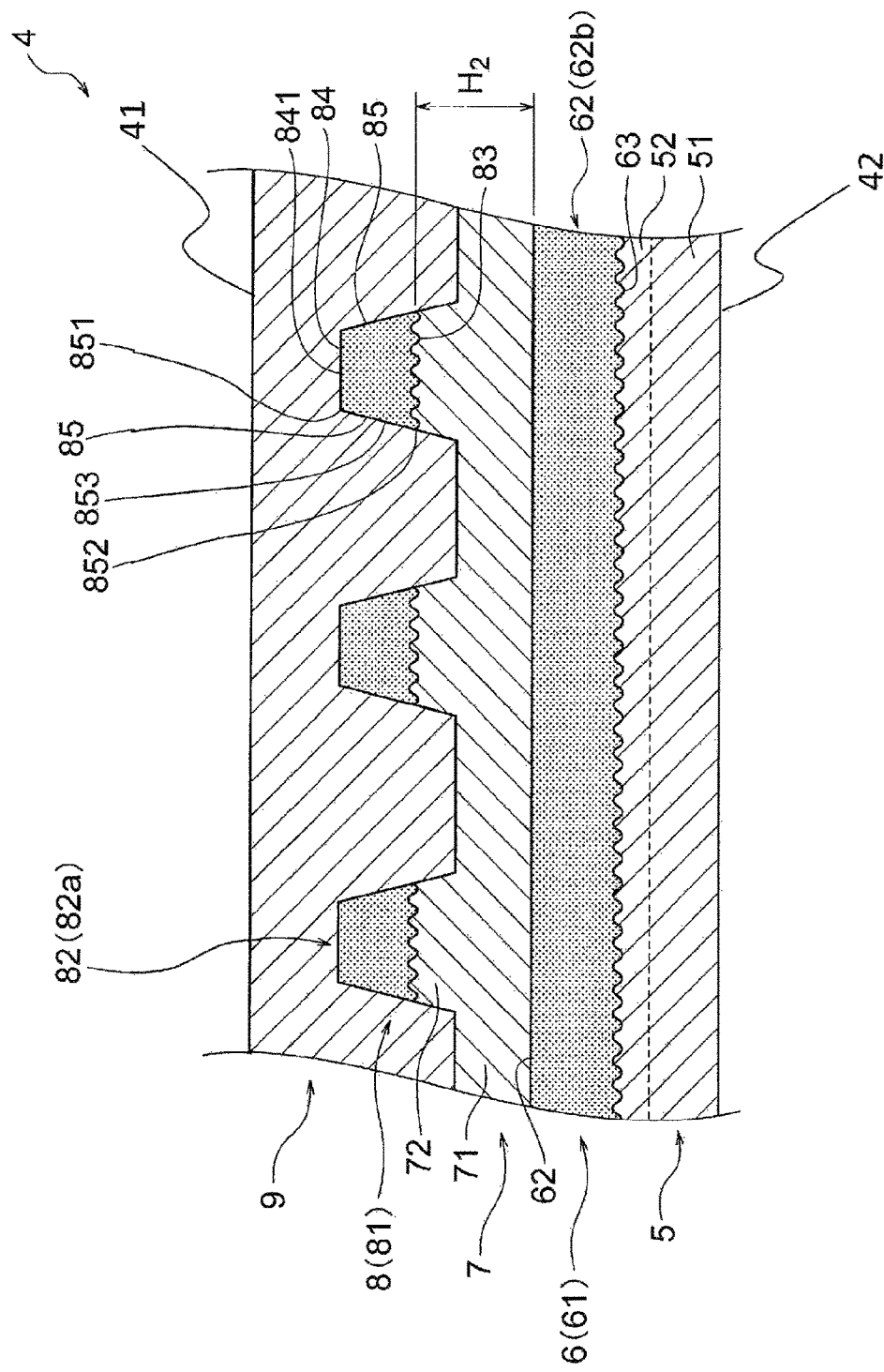
FIG. 6 is a cross-sectional view along line VI-VI of FIG. 4.
Figure 7:
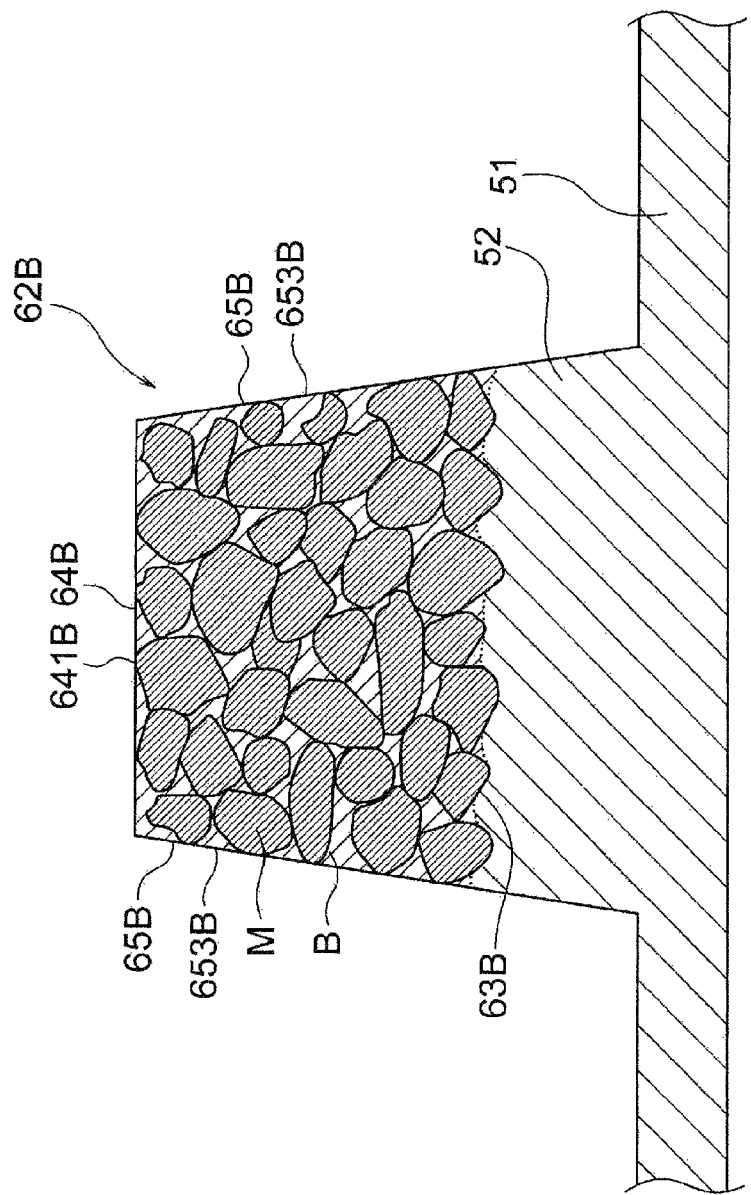
FIG. 7 is a cross-sectional view for describing a first conductor line according to one or more embodiments of the present invention.

FIG. 4 is a transparent plan view illustrating a wiring body according to one or more embodiments of the present invention, FIG. 5 is a cross-sectional view along line V-V of FIG. 4, FIG. 6 is a cross-sectional view along line VI-VI of FIG. 4, and FIG. 7 is a cross-sectional view for describing a first conductor line according to one or more embodiments of the present invention. For easy understanding of the structure of the wiring body, FIG. 4 is illustrated with solid lines for a second conductor layer 8 and broken lines for a first conductor layer 6.

As illustrated in FIG. 5, the wiring body 4 comprises the first resin layer 5, the first conductor layer 6, the second resin layer 7, the second conductor layer 8, and the third resin layer 9. The wiring body 4 of one or more embodiments, which is supported by at least one of the cover glass 31 and the liquid crystal panel 32, has a configuration that does not require an additional component, such as a base material, which supports the first and second conductor layers 6 and 8 by direct adhesion.

In one or more embodiments, the second conductor layer 8 has a similar configuration to that of the first conductor layer 6. In the following description, therefore, detailed description of the second conductor layer 8 (including elements of the second conductor layer 8) will be omitted. The "wiring body 4" in one or more embodiments corresponds to an example of the "wiring body."

The first resin layer 5 of one or more embodiment is composed of a material having optical isotropy. Examples of the material which constitutes such a first resin layer 5 include a UV curable resin, such as an epoxy resin, acrylic resin, urethane resin, silicone resin, and phenol resin, and a thermoset resin.

The material which constitutes the first resin layer 5 has a retardation value Re of 10 nm or less. The retardation value Re is 5 nm or less or 1 nm or less. In the present description, a material having optical isotropy refers to a material of which the retardation value Re is 10 nm or less. When the first resin layer 5 is composed of a material having optical isotropy, the birefringence for light incident on the wiring body 4 is suppressed. This can suppress the deterioration in visibility of the conductor-layer-equipped structure 2.

As is known in the art, retardation is a phenomenon in which light incident on an anisotropic substance such as a crystal is split into two light waves having directions of vibration orthogonal to each other. That is, when unpolarized light is incident on a birefringent material, the incident light is split into two light rays: an ordinary ray and an extraordinary ray, and their directions of vibration are orthogonal to each other. The extraordinary ray is a light ray of which the propagation speed differs depending on the propagation direction while the ordinary ray is a light ray of which the propagation speed is independent of the propagation direction.

The retardation value Re is represented by a following Expression (7):

$$Re = (nx - ny) \times d \quad (7)$$

where nx represents a refractive index in a direction (slow axis direction) in which the refractive index is largest in the plane of a resin layer (i.e. extraordinary refractive index), ny represents a refractive index in a direction (fast axis direction) that is orthogonal to the slow axis direction (i.e. ordinary refractive index), and d represents a thickness of the resin layer.

Such a retardation value can be measured in accordance with a JIS method (JIS K7142). In one or more embodiments, the retardation value Re is measured using a known measurement apparatus as a retardation value to light of a wavelength of 550 nm, but the wavelength for measurement is not particularly limited to this. The retardation value Re satisfies the above-described condition across the entire wavelength range of visible light.

In one or more embodiments, from the viewpoint of suppressing the deterioration in visibility of the conductor-layer-equipped structure 2, a following Expression (8) is established:

$$1.45 \leq N_1 \leq 1.55 \quad (8)$$

In the above Expression (8), $N_1$ represents a refractive index of the material which constitutes the first resin layer 5. Such a refractive index can be measured in accordance with a JIS method (JIS K7142).

What are exemplified as materials that constitute the above-described cover glass 31 and liquid crystal panel 32 have a refractive index of 1.47 or more and 1.52 or less, which satisfies the above Expression (8). This can reduce the difference of refractive index (absolute refractive index) between the cover glass 31 and the first resin layer 5 and suppress the occurrence of scattering or the like of light incident on the wiring body 4. The deterioration in visibility of the conductor-layer-equipped structure 2 can thus be suppressed.

The refractive index $N_1$ is 1.47 or more and 1.52 or less ($1.47 \leq N_1 \leq 1.52$).

In one or more embodiments, from the viewpoint of further suppressing the deterioration in visibility of the conductor-layer-equipped structure 2, a following Expression (9) is established:

$$97\% \leq T_1 \quad (9)$$

In the above Expression (9), $T_1$ represents a total light transmittance of the material which constitutes the first resin layer 5. Such a total light transmittance can be measured in accordance with a JIS method (JIS K7375).

The total light transmittance $T_1$ is 99% or more ($99\% \leq T_1$).

From the viewpoint of suppressing misalignment between the first and second conductor layers 6 and 8 (in particular, between the first and second mesh-like electrode layers 61 and 81), the material which constitutes the first resin layer 5 is a material having a small volume contraction in the process of forming the first resin layer 5. Specifically, the material which constitutes the first resin layer 5 is a UV-curable resin that does not require a solvent during the process of coating with the material.

As illustrated in FIG. 5 and FIG. 6, the first resin layer 5 is constituted of a flat part 51 that is provided to have an approximately constant thickness and support parts 52 that are formed on the flat part 51. The support parts 52 are formed between the flat part 51 and the first conductor layer 6 so as to protrude toward a direction departing from the flat part 51 (upward direction in FIG. 5).

The first resin layer 5 is in contact with the first conductor layer 6 at upper surfaces of the support parts 52 (surfaces of the support parts 52 at the upper side in FIG. 5). Each support part 52 has two linear side surfaces that incline so as to come close to each other in a transverse cross-sectional view as departing from the flat part 51. As used herein, the transverse cross-sectional view refers to a cross section along the transverse direction of a first conductor line 62 (described later) that constitutes each first mesh-like electrode layer 61 in contact with the support parts 52.

Boundaries between the support parts 52 and the first conductor layer 6 are in uneven (irregular) shapes that correspond to uneven shapes of contact surfaces of the first conductor layer 6 (such as contact surfaces 63 of first conductor lines 62 (which will be described later)). Such uneven shapes are formed due to the surface roughness of the contact surfaces of the first conductor layer 6. As illustrated in FIG. 6, boundaries between the support parts 52 and the first conductor layer 6 in a cross-section along the extending direction of the first conductor layer 6 are also in uneven shapes that correspond to the uneven shapes of adhesion surfaces of the first conductor layer 6. The surface roughness of contact surfaces of the first conductor layer 6 will be described later in detail with reference to an example of the surface roughness of contact surfaces 63 of first conductor lines 62. For easy understanding of the wiring body 4 in one or more embodiments, FIG. 5 and FIG. 6 illustrate the uneven shapes of boundaries between the support parts 52 and the first conductor layer 6 in an exaggerated manner.

In one or more embodiments, from the viewpoint of reducing the thickness of the conductor-layer-equipped structure 2, a following Expression (10) is established:

$$0.1 \ \mu m \leq H_1 \leq 50 \ \mu m \tag{10}$$

In the above Expression (10), $H_1$ represents a height of the first resin layer 5. The height $H_1$ of the first resin layer 5 refers to a total thickness (height) obtained by summing up the thickness (height) of the flat part 51 which constitutes the first resin layer 5 and the thickness (height) of the support parts.

The material which constitutes the first resin layer 5 of one or more embodiments is a crosslinked resin material. The coefficient of thermal expansion of the first resin layer 5 can therefore be reduced as compared with a state before crosslinking the material which constitutes the first resin layer 5. Moreover, the strength and hardness of the first resin layer 5 can be enhanced as compared with the state before crosslinking the material which constitutes the first resin layer 5. Furthermore, the shape of the first resin layer 5 can easily be maintained because the first resin layer 5 becomes difficult to dissolve in an organic solvent. Such a crosslinked resin material has a characteristic that the modulus of elasticity decreases below a certain temperature as the temperature increases, but under a relatively higher temperature than the certain temperature, the modulus of elasticity rather increases. As is known in the art, the modulus of a material that is not crosslinked continues to decrease monotonically as the temperature increases.

A resin material having a relatively high crosslink density may be used as the material which constitutes the first resin layer 5. The crosslink density of the resin material can be expressed using a molecular weight between crosslinks of the resin material. The molecular weight between crosslinks of the resin material can be represented by a following Expression (11):

$$Mc = 2(1+\mu)\rho RT/E \tag{11}$$

In the above Expression (11), Mc represents a molecular weight between crosslinks, $\mu$ represents a Poisson's ratio, $\rho$ represents a density, R represents a gas constant, T represents an absolute temperature, and E represents a modulus of elasticity.

In one or more embodiments, from the viewpoint of increasing the crosslink density of the material which constitutes the first resin layer 5, the molecular weight between crosslinks of the material which constitutes the first resin layer 5 is less than 10,000 g/mol or less than 3,000 g/mol. The molecular weight between crosslinks of the material which constitutes the first resin layer 5 is less than 250 times or less than 80 times the monomer molecular weight. From the viewpoint of preventing the first resin layer 5 from being brittle, the molecular weight between crosslinks of the material which constitutes the first resin layer 5 is 1,000 g/mol or more.

The "first resin layer 5" in one or more embodiments corresponds to an example of the "first resin layer."

As illustrated in FIG. 4, the first conductor layer 6 includes the first mesh-like electrode layers 61 and the lead wires 66. The first mesh-like electrode layers 61 are detection electrodes of the input device 1, which extend in the Y-direction as illustrated in FIG. 4. The first mesh-like electrode layers 61 are laid on the support parts 52 of the first resin layer 5 and formed so as to protrude toward the +Z-direction (see FIG. 5 and FIG. 6). The "first conductor layer 6" in one or more embodiments corresponds to an example of the "first conductor layer."

The first mesh-like electrode layers 61 are constituted of a conductive powder and a binder resin. In the first mesh-like electrode layers 61, the conductive powder exists to be approximately uniformly dispersed in the binder resin, and particles of the conductive power are in contact with one another thereby to allow the first mesh-like electrode layers 61 to have conductivity.

Such first mesh-like electrode layers 61 are formed by applying a conductive paste and curing it. Specific examples of such a conductive paste include a conductive paste that is constituted by mixing water or a solvent and various additives to the above-described conductive powder and binder resin.

Examples of a material of the conductive powder include a metal material, such as silver, copper, nickel, tin, bismuth, zinc, indium, and palladium, and a carbon-based material, such as graphite, carbon black (furnace black, acetylene black, Ketjen black), carbon nanotube, and carbon nanofiber. Metal salts that are salts of the above-described metal materials may also be used, other than the conductive powder.

Conductive powder that can be used as the conductive powder may have a size $\varphi$ of 0.5 μm or more and 2 μm or less ($0.5 \leq \varphi \leq 2$), for example, in accordance with the widths of the first mesh-like electrode layers 61 to be formed (e.g. first conductor lines 62). From the viewpoint of stabilizing the electric resistance value of the first mesh-like electrode layers 61, a conductive powder having an average size $\varphi$ that is not larger than half the widths of the first mesh-like electrode layers 61 to be formed may be used. When a carbon-based material is used as the conductive powder, particles of which the specific surface area as measured by the BET method is 20 m$^2$/g or more may be used.

When the first mesh-like electrode layers 61 are required to have a relatively small electric resistance value that is not larger than a certain level, a metal material as the conductive material may be used, while when the first mesh-like electrode layers 61 are accepted to have a relatively large electric resistance value that is not smaller than a certain level, a carbon-based material can be used as the conductive material. From the viewpoint of improving the haze and total light reflectance of a mesh film, a carbon-based material as the conductive powder may be used.

Examples of the binder include acrylic resin, polyester resin, epoxy resin, vinyl resin, urethane resin, phenol resin, and polyimide resin. Examples of the solvent include α-terpineol, butyl carbitol acetate, butyl carbitol, 1-decanol, butyl cellosolve, diethylene glycol monoethyl ether acetate, and tetradecane. The binder resin may be omitted from the material which constitutes the first mesh-like electrode layers 61.

As illustrated in FIG. 4, each of the first mesh-like electrode layers 61 is configured such that a plurality of first conductor lines 62a and 62b having conductivity intersects with one another, and has a shape as a whole in which a plurality of quadrangle-shaped meshes is arranged to repeat. The "first conductor lines 62a and 62b" in one or more embodiments correspond to an example of the "first conductor line" in the present invention. In the present description, the "first conductor lines 62a" and the "first conductor lines 62b" may be collectively referred to as "first conductor lines 62," as necessary.

As illustrated in FIG. 5 and FIG. 6, each outer shape of the first conductor lines 62 of one or more embodiments is constituted of a contact surface 63, a top surface 64, and two side surfaces 65 and 65. The contact surface 63 is a surface that is in contact with the first resin layer 5. The first mesh-like electrode layers 61 of one or more embodiments are supported by the first resin layer 5, in which case the contact surface 63 is a surface that is located at the first resin layer 5 side with respect to the top surface 64. The contact surface 63 is an uneven surface with fine irregularities in the transverse cross section.

On the other hand, the top surface 64 is a surface opposite to the contact surface 63 and is substantially in parallel to the lower surface (surface at the lower side in FIG. 5) of the first resin layer 5. The top surface 64 includes a flat part 641 in the cross-section of the first conductor line 62 in its width direction. The flat part 641 is a linear portion (i.e. portion with a considerably large radius of curvature) that exists on the top surface 64 in the cross-section of the first conductor line 62 in its width direction, and the flatness of the flat part 641 is 0.5 μm or less. The flatness can be measured in accordance with a JIS method (JIS B0621 (1984)).

In one or more embodiments, the flatness of the flat part 641 is obtained using a contactless-type measurement method with laser light. Specifically, a measuring object (the top surface 64 in one or more embodiments) is irradiated with strip-like laser light and the reflected light is focused on an imaging element (e.g. two-dimensional CMOS) to measure the flatness. The method of calculating the flatness may be a method that includes setting flat surfaces on an object surface so as to pass through three points separate from one another as much as possible and calculating the maximum value of deviation as the flatness (maximum deviation-type flatness). The methods of measuring and calculating the flatness are not particularly limited to the above. For example, the method of measuring the flatness may be a contact-type measurement method using a dial gauge or other appropriate gauge. The method of calculating the flatness may also be a method that includes interposing an object surface between parallel flat surfaces and calculating a value of space generated due to the interposition as the flatness (maximum slope-type flatness).

The flat part 641 of one or more embodiments is formed at approximately the entire area of the top surface 64. The location at which the flat part 641 is formed is not particularly limited to the above and the flat part 641 may be formed at a part of the top surface 64. In this case, for example, the flat part may be formed at a region that does not include both ends of the top surface. When the flat part is formed at a part of the top surface, the width of the flat part may be at least ½ or more of the width of the top surface.

The side surfaces 65 and 65 are linear surfaces that incline so as to come close to each other in the transverse cross-sectional view as departing from the first resin layer 5. In one or more embodiments, the side surfaces 65 and 65 are continuous with the support part 52 to be contacted of the first resin layer 5 in the transverse cross-sectional view.

Each side surface 65 is located between the top surface 64 and the contact surface 63. The side surface 65 connects to the top surface 64 at a first portion 651 and connects to the contact surface 63 at a second portion 652. The first conductor line 62 of one or more embodiments has a tapered shape that narrows toward the second conductor layer 8 side and, therefore, the second portion 652 is located outside the first portion 651. In the cross-section of the first conductor line 62 in its width direction, the side surface 65 of one or more embodiments represents a linear surface that extends on a virtual straight line (not illustrated) passing through the first and second portions 651 and 652.

The shape of the side surface 65 is not particularly limited to the above. For example, in the cross-section of the first conductor line 62 in its width direction, the side surface 65 may protrude outside the virtual straight line passing through the first and second portions 651 and 652. Thus, the side surface 65 is in a shape that is not depressed inside the virtual straight line passing through the first and second portions 651 and 652 in the cross-section of the first conductor line 62 in its width direction (i.e. in a shape in which the lower part of the conductor pattern does not widen in a divergent fashion).

The side surface 65 of one or more embodiments includes a flat part 653 in the cross-section of the first conductor line 62 in its width direction. The flat part 653 is a linear portion (i.e. portion with a considerably large radius of curvature) that exists on the side surface 65 in the cross-section of the first conductor line 62 in its width direction, and the flatness of the flat part 653 is 0.5 μm or less. In one or more embodiments, the flat part 653 is formed at approximately the entire area of the side surface 65. The shape of the flat part 653 is not particularly limited to the above and the flat part 653 may be formed at a part of the side surface 65.

From the viewpoint of suppressing the diffuse reflection of light at the side surface 65, an angle $\theta_1$ between the side surface 65 and the top surface 64 is 90° to 170° (90°≤$\theta_1$≤170°) or 90° to 120° (90°≤$\theta_1$≤120°). In one or more embodiments, in one first conductor line 62, the angle between one side surface 65 and the top surface 64 is substantially the same as the angle between the other side surface 65 and the top surface 64.

From the viewpoint of tightly fixing the first mesh-like electrode layer 61 and the first resin layer 5 to each other, the surface roughness of the contact surface 63 of the first mesh-like electrode layer 61 in one or more embodiments is relatively rougher than the surface roughness of the top surface 64. Since the top surface 64 includes the flat surface 641 in one or more embodiments, the above relative relationship of the surface roughness in the first conductor line 62 (relationship that the surface roughness of the contact surface 63 is relatively rougher than the surface roughness of the top surface 64) is established. Specifically, the surface roughness Ra of the contact surface 63 is about 0.1 μm to 3.0 μm while the surface roughness Ra of the top surface 64 is about 0.001 μm to 1.0 μm. The surface roughness Ra of the contact surface 63 of the first conductor line 62 is 0.1 μm to 0.5 μm and the surface roughness Ra of the top surface 64 is 0.001 μm to 0.3 μm. The ratio of the surface roughness of the top surface 64 and the surface roughness of the contact surface 63 (ratio of the surface roughness of the top surface 64 to the surface roughness of the contact surface 63) is 0.01 or more and less than 1 or 0.1 or more and less than 1. The surface roughness of the top surface 64 is ⅕ or less of the width (maximum width) of the first conductor line 62. Such surface roughness can be measured in accordance with a JIS method (JIS B0601 (revised on Mar. 21, 2013)).

As used herein, the "surface roughness Ra" refers to "arithmetic average roughness Ra" as described in the JIS method (JIS B0601 (revised on Mar. 21, 2013)). The "calculated average roughness Ra" represents a roughness parameter that is obtained by filtering out long-wavelength components (waviness components) from a profile curve. Separation of the waviness components from the profile curve may be performed on the basis of the measurement condition which is necessary for obtaining a form (such as the size of an object, for example).

In one or more embodiments, the side surface 65 includes the flat part 653. The surface roughness of the contact surface 63 is therefore relatively rougher than that of the side surface 65. Specifically, the surface roughness Ra of the contact surface 63 of the first conductor line 62 is 0.1 µm to 3 µm while the surface roughness Ra of the side surface 65 is 0.001 µm to 1.0 µm.

In one or more embodiments, the surface roughness of the contact surface 63 is relatively rougher than the surface roughness of the top surface 64 and side surfaces 65 and, therefore, the diffuse reflectance of the wiring body 4 at other surfaces than the contact surface 63 (i.e. at the top surface 64 and side surfaces 65) is relatively smaller than the diffuse reflectance of the wiring body 4 at the contact surface 63. From the viewpoint of improving the visibility of the wiring body 4, the ratio of the diffuse reflectance of the wiring body 4 at other surfaces than the contact surface 63 and the diffuse reflectance of the wiring body 4 at the contact surface 63 (ratio of the diffuse reflectance of the wiring body 4 at other surfaces than the contact surface 63 to the diffuse reflectance of the wiring body 4 at the contact surface 63) is 0.1 or more and less than 1 or 0.3 or more and less than 1.

An example of the shape of a first conductor line 62B having the above-described relative relationship of the surface roughness between the contact surface and other surfaces than the contact surface will be described with reference to FIG. 7. As illustrated in FIG. 7, in the first electrode line 62B which is constituted by conductive powder particles M and a binder resin B, a number of the conductive powder particles M are dispersed in the binder resin B. The first conductor line 62B is formed with a contact surface 63B having an uneven shape in which a part of the conductive powder particles M protrudes from the binder resin B in the cross-section in the width direction and a top surface 64B and side surfaces 65B each having a smooth shape in which the binder resin B gets into spaces between the conductive powder particles M to cover the conductive powder particles M. Thus, in the top surface 64B and the side surfaces 65B, the conductive powder particles M are covered with the binder resin B, so that the electric insulation is improved between adjacent first conductor lines 62B and the occurrence of migration is suppressed.

In the form illustrated in FIG. 7, the surface roughness of the contact surface 63B is relatively large because a part of the conductive powder particles M protrudes from the binder resin B. On the other hand, the surface roughness of the top surface 64B is relatively small because the conductive powder particles M are covered by the binder resin B at the top surface 64B. Thus, the surface roughness of the contact surface 63B is relatively rougher than the surface roughness of the top surface 64B.

In addition, the surface roughness of the side surface 65B is relatively small because the conductive powder particles M are covered by the binder resin B at the side surface 65B. Thus, the surface roughness of the contact surface 63B is relatively rougher than the surface roughness of the side surface 65B.

The "contact surface 63" in one or more embodiments corresponds to an example of the "first surface," the "top surface 64" in one or more embodiments corresponds to an example of the "second surface," and the "side surfaces 65 and 65" in one or more embodiments correspond to an example of the "side surface."

Referring again to FIG. 4, in the first mesh-like electrode layers 61 of one or more embodiments, the first conductor lines 62 are arranged as below. That is, each first conductor line 62a extends linearly along a direction inclined by +45° with respect to the X-direction (this direction will be also simply referred to as a "first direction," hereinafter), and the plurality of the first conductor lines 62a is arranged at a regular pitch $P_1$ in a direction that is substantially orthogonal to the first direction (this direction will be also simply referred to as a "second direction," hereinafter).

On the other hand, each first conductor line 62b extends linearly along the second direction, and the plurality of the first conductor lines 62b is arranged at a regular pitch $P_2$ in the first direction. The first conductor lines 62a and 62b are orthogonal to one another and the first mesh-like electrode layers 61 are thereby formed in which quadrangle-shaped meshes (rhombus-shaped meshes) are arranged to repeat. As used in the present description, the pitch refers to a center-to-center distance.

The structure of the first mesh-like electrode layers 61 is not particularly limited to the above. For example, the pitch $P_1$ of the first conductor lines 62a is substantially the same as the pitch $P_2$ of the first conductor lines 62b in one or more embodiments ($P_1=P_2$), but the present invention is not limited to this, and the pitch $P_1$ of the first conductor lines 62a may be different from the pitch $P_2$ of the first conductor lines 62b ($P_1 \neq P_2$).

In one or more embodiments, the first direction, along which the first conductor lines 62a extend, is a direction inclined by +45° with respect to the X-direction while the second direction, along which the first conductor lines 62b extend, is a direction that is substantially orthogonal to the first direction, but the extending directions of the first and second directions (i.e. an angle of the first direction with respect to the X-axis and an angle of the second direction with respect to the X-axis) can be freely set.

The mesh shape of the first mesh-like electrode layers 61 may have a certain geometrical pattern. That is, the mesh shape may be a triangle, such as a regular triangle, isosceles triangle and right triangle, and may also be a quadrangle, such as a rectangle, square, rhombus, parallelogram and trapezoid. The mesh shape may also be an n-sided polygon, such as a hexagon, octagon, dodecagon and icosagon, circle, ellipsoid, and star-shape.

Thus, in the first mesh-like electrode layers 61, a geometrical pattern obtained by repeating any of various figure units can be used as the mesh shape. In one or more embodiments, the first conductor lines 62 are in a linear form, but the present invention is not particularly limited to this, and they may be in a specific form, such as a curved form, horseshoe-like form and zigzag form.

In one or more embodiments, the first conductor lines 62a and 62b have approximately the same line width, but may also have different line widths. Specifically, the width $W_1$ (see FIG. 5) of the first conductor lines 62a and 62b is 50 nm to 1,000 µm, 500 nm to 150 µm, 1 µm to 10 µm, or 1 µm to 5 µm.

As illustrated in FIG. 4, the lead wires 66 are provided to correspond to the first mesh-like electrode layers 61. In one or more embodiments, three lead wires 66 are formed for the three first mesh-like electrode layers 61. The lead wires 66 are led out from the −Y-direction side in the figure of the first mesh-like electrode layers 61 via lead parts 67. The lead wires 66 are formed integrally with respective first mesh-like electrode layers 61 using the same material as that of the first mesh-like electrode layers 61 described above.

As used herein, the term "integrally with" refers to a situation in which a member and another member are not separated from each other and they are formed as a one-body structure using the same material (such as using conductive powder of the same particle size and the same binder resin). In the outer edges of the first mesh-like electrode layers 61, locations at which the lead wires 66 are provided are not particularly limited. In one or more embodiments, the lead wires 66 are connected to the first mesh-like electrode layers 61 via the lead parts 67, but the present invention is not particularly limited to this, and the lead wires 66 and the first mesh-like electrode layers 61 may also be directly connected.

As illustrated in FIG. 5 and FIG. 6, the second resin layer 7 is formed on the first resin layer 5 so as to cover the first conductor layer 6. In addition, the second conductor layer 8 is formed on the second resin layer 7. As a result, the second resin layer 7 is interposed between the first conductor layer 6 and the second conductor layer 8 and serves to ensure the insulation therebetween.

In one or more embodiments, the wiring body 4 including the first and second conductor layers 6 and 8 is supported by at least one of the cover glass 31 and the liquid crystal panel 32. In this case, it suffices that the second resin layer 7 is merely an insulating material (dielectric material) that is interposed between the first and second conductor layers 6 and 8 (i.e. two electrodes). Thus, the second resin layer 7 is not required to have rigidity enough to function as a support body that supports electrode layers, which would be necessary in the prior art. It is therefore possible to reduce the thickness (height) of the second resin layer 7, and the wiring body 4 can be made thin accordingly.

In one or more embodiments, the first resin layer 5 and the second resin layer 7 adhere directly to each other by chemical bond. The first and second resin layers 5 and 7 may be bonded to each other due to intermolecular force and/or anchor effect between the resin layers 5 and 7 in addition to the chemical bond. The adhesion strength between the first resin layer 5 and the second resin layer 7 in such cases is at least 10 N/cm or more. The adhesion strength between the first resin layer 5 and the second resin layer 7 is larger than the breaking strength of the first and second resin layers 5 and 7.

Examples of the material which constitutes the second resin layer 7 include the same materials as those for constituting the first resin layer 5. In one or more embodiments, the wiring body 4 is constituted by selecting the same composition for both the material which constitutes the first resin layer 5 and the material which constitutes the second resin layer 7.

In other words, like the first resin layer 5, the second resin layer 7 of one or more embodiments is constituted by a material having optical isotropy, thereby to suppress the birefringence for light incident on the wiring body 4. As in the first resin layer 5, the retardation value Re of the material which constitutes the second resin layer 7 is 10 nm or less, 5 nm or less, or 1 nm or less.

From the viewpoint of suppressing misalignment between the first and second conductor layers 6 and 8 (in particular, between the first and second mesh-like electrode layers 61 and 81), the material which constitutes the second resin layer 7 is a material having a small volume contraction in the process of forming the second resin layer 7. Specifically, the material which constitutes the second resin layer 7 is a UV-curable resin that does not require a solvent during the process of coating with the material.

In the present description, the situation that the materials which constitute two resin layers have the same composition refers to the following case. That is, this case is a case in which one or more unit structures that constitute a main chain of the material which constitutes one resin layer (e.g. the first resin layer 5) are all included in a main chain of the material which constitutes the other resin layer (e.g. the second resin layer 7) and one or more unit structures that constitute the main chain of the material which constitutes the other resin layer are all included in the main chain of the material which constitutes the one resin layer.

When the materials which constitute two resin layers have the same composition, one or more substituent groups or functional groups that constitute a side chain of the material which constitutes one resin layer is all included in a side chain of the material which constitutes the other resin layer and one or more substituent groups or functional groups that constitute the side chain of the material which constitutes the other resin layer be all included in the side chain of the material which constitutes the one resin layer.

In addition or alternatively, when the materials which constitute two resin layers have the same composition, the average molecular weight of the material which constitutes one resin layer and the average molecular weight of the material which constitutes the other resin layer are substantially the same.

In one or more embodiments, when the materials which constitute two resin layers have the same composition, one or more substituent groups or functional groups that constitute a side chain of the material which constitutes one resin layer be all included in a side chain of the material which constitutes the other resin layer, one or more substituent groups or functional groups that constitute the side chain of the material which constitutes the other resin layer be all included in the side chain of the material which constitutes the one resin layer, and the average molecular weight of the material which constitutes one resin layer and the average molecular weight of the material which constitutes the other resin layer are substantially the same.

In addition or alternatively, when the materials which constitute the two resin layers have the same composition, the infrared absorption spectrum obtained by infrared spectroscopic analysis for one resin layer and the infrared absorption spectrum obtained by infrared spectroscopic analysis for the other resin layer may be substantially identical.

In one or more embodiments, from the viewpoint of suppressing the deterioration in visibility of the wiring body 4, the following Expressions (12) and/or (13) are established as in the first resin layer 5:

$$1.45 \leq N_2 \leq 1.55 \quad (12) \text{ and}$$

$$97\% \leq T_2 \quad (13).$$

In the above Expressions (12) and (13), $N_2$ represents a refractive index of the material which constitutes the second resin layer 7 and $T_2$ represents a total light transmittance of the material which constitutes the second resin layer 7.

In one or more embodiments, the refractive index $N_1$ of the material which constitutes the first resin layer 5 and the refractive index $N_2$ of the material which constitutes the second resin layer 7 are substantially the same because the materials which constitute the first and second resin layers 5 and 7 have the same composition. This can suppress the occurrence of scattering or the like of light incident on the wiring body 4 at the interface between the first and second resin layers 5 and 7. Moreover, the deterioration in visibility of the wiring body 4 can be further suppressed by establishing the above Expressions (12) and (13).

In the present description, the situation that the refractive index $N_1$ of the material which constitutes the first resin layer 5 and the refractive index $N_2$ of the material which constitutes the second resin layer 7 are substantially the same refers to a case in which the absolute value of the difference between these refractive indices $N_1$ and $N_2$ is 0.01 or less.

The refractive index $N_2$ is 1.47 or more and 1.52 or less ($1.47 \leq N_2 \leq 1.52$) and the total light transmittance $T_2$ is 99% or more ($99\% \leq T_2$).

Like the material which constitutes the first resin layer 5, the material which constitutes the second resin layer 7 of one or more embodiments is a crosslinked resin material. The coefficient of thermal expansion of the second resin layer 7 can therefore be reduced as compared with a state before crosslinking the material which constitutes the second resin layer 7. Moreover, the strength and hardness of the second resin layer 7 can be enhanced as compared with the state before crosslinking the material which constitutes the second resin layer 7. Furthermore, the shape of the second resin layer 7 can easily be maintained because the second resin layer 7 becomes difficult to dissolve in an organic solvent.

A resin material having a relatively high crosslink density may be used as the material which constitutes the second resin layer 7. Specifically, as represented by a molecular weight between crosslinks of the material which constitutes the second resin layer 7, the molecular weight between crosslinks of the material which constitutes the second resin layer 7 is less than 10,000 g/mol or less than 3,000 g/mol. The molecular weight between crosslinks of the material which constitutes the second resin layer 7 is less than 250 times or less than 80 times the monomer molecular weight. From the viewpoint of preventing the second resin layer 7 from being brittle, the molecular weight between crosslinks of the material which constitutes the second resin layer 7 is 1,000 g/mol or more.

As illustrated in FIG. 5 and FIG. 6, the second resin layer 7 is constituted of a main part 71 that covers the first conductor layer 6 and support parts 72 that are formed on the main part 71. The support parts 72 are formed between the main part 71 and the second conductor layer 8 so as to protrude toward a direction departing from the first resin layer 5 (upward direction in FIG. 6). The rigidity of the second resin layer 7 is enhanced at portions supporting the second conductor layer 8 by forming the support parts 72. Boundaries between the support parts 72 and the second conductor layer 8 are in uneven shapes that correspond to uneven shapes of contact surfaces of the second conductor layer 8 (such as contact surfaces 83 of second conductor lines 82). Such uneven shapes are formed due to the surface roughness of the contact surfaces of the second conductor layer 8. As illustrated in FIG. 5, boundaries between the support parts 72 and the second conductor layer 8 in a cross-section along the extending direction of the second conductor layer 8 are also in uneven shapes that correspond to the uneven shapes of the contact surfaces of the second conductor layer 8. The surface roughness of the second conductor layer 8 will be described later in detail with reference to an example of the surface roughness of contact surfaces 83 of second conductor lines 82. For easy understanding of the wiring body 4 in one or more embodiments, FIG. 5 and FIG. 6 illustrate the uneven shapes of boundaries between the support parts 72 and the second conductor layer 8 in an exaggerated manner.

The second resin layer 7 is in contact with the second conductor layer 8 at upper surfaces of the support parts 72 (surfaces of the support parts 72 at the upper side in FIG. 6). Each support part 72 has two linear side surfaces that incline so as to come close to each other in a transverse cross-sectional view as departing from the first resin layer 5. As used herein, the transverse cross-sectional view refers to a cross section along the transverse direction of a second conductor line 82 (see FIG. 6) that constitutes each second mesh-like electrode layer 81 in contact with the support parts 72.

In one or more embodiments, from the viewpoint of reducing the thickness of the wiring body 4, a following Expression (14) is established:

$$20 \ \mu m \leq H_2 \leq 200 \ \mu m \quad (14).$$

In the above Expression (14), $H_2$ represents a height of the second resin layer 7. The height $H_2$ of the second resin layer 7 refers to a thickness (height) of portions of the second resin layer 7 which are interposed between the top surfaces 64 of the first conductor lines 62 and the contact surfaces 83 of the second conductor lines 82.

In one or more embodiments, a following Expression (15) is established or a following Expression (16) is established.

$$H_1 < H_2 \quad (15) \text{ and}$$

$$H_1 < H_2 \leq 20 \times H_1 \quad (16).$$

The "second resin layer 7" in one or more embodiments corresponds to an example of the "second resin layer".

As illustrated in FIG. 4, the second conductor layer 8, like the first conductor layer 6, includes the second mesh-like electrode layers 81 and the lead wires 86. The second mesh-like electrode layers 81 are detection electrodes of the input device 1, which extend in the X-direction as illustrated in FIG. 4. The "second conductor layer 8" in one or more embodiments corresponds to an example of the "second conductor layer."

Like the first mesh-like electrode layers 61, each of the second mesh-like electrode layers 81 is configured such that a plurality of second conductor lines 82a and 82b having conductivity intersects with one another, and has a shape as a whole in which a plurality of quadrangle-shaped meshes is arranged to repeat.

The "second conductor lines 82a and 82b" in one or more embodiments correspond to an example of the "second conductor line." In the present description, the "second conductor lines 82a" and the "second conductor lines 82b" may be collectively referred to as "second conductor lines 82," as necessary.

As illustrated in FIG. 5 and FIG. 6, each outer shape of the second conductor lines 82 of one or more embodiments is constituted of a contact surface 83, a top surface 84, and two side surfaces 85 and 85, as in the first conductor lines 62. The contact surface 83 is a surface that is in contact with the second resin layer 7. On the other hand, the top surface 84 is a surface opposite to the contact surface 83. The side surfaces 85 and 85 are linear surfaces that incline so as to come close to each other in the transverse cross-sectional view as departing from the second resin layer 7.

The top surface 84 includes a flat part 841 in the cross-section of the second conductor line 82 its width direction. The flat part 841 is a linear portion (i.e. portion with a considerably large radius of curvature) that exists on the top surface 84 in the cross-section of the second conductor line 82 in its width direction, and the flatness of the flat part 841 is 0.5 μm or less.

The flat part 841 of one or more embodiments is formed at approximately the entire area of the top surface 84. The location at which the flat part 841 is formed is not particularly limited to the above and the flat part 841 may be formed at a part of the top surface 84. In this case, for example, the flat part may be formed at a region that does not include both ends of the top surface. When the flat part is formed at a part of the top surface, the width of the flat part may be at least ½ or more of the width of the top surface.

Each side surface 85 is located between the top surface 84 and the contact surface 83. The side surface 85 connects to the top surface 84 at a first portion 851 and connects to the contact surface 83 at a second portion 852. The second conductor line 82 of one or more embodiments has a tapered shape that narrows toward the side departing from the first conductor layer 6 and, therefore, the second portion 852 is located outside the first portion 851. In the cross-section of the second conductor line 82 in its width direction, the side surface 85 represents a linear surface that extends on a virtual straight line (not illustrated) passing through the first and second portions 851 and 852.

The shape of the side surface 85 is not particularly limited to the above. For example, in the cross-section of the second conductor line 82 in its width direction, the side surface 85 may protrude outside the virtual straight line passing through the first and second portions 851 and 852. Thus, the side surface 85 is in a shape that is not depressed inside the virtual straight line passing through the first and second portions 851 and 852 in the cross-section of the second conductor line 82 in its width direction (i.e. in a shape in which the lower part of the second conductor line 82 does not widen in a divergent fashion).

The side surface 85 of one or more embodiments includes a flat part 853 in the cross-section of the second conductor line 82 in its width direction. The flat part 853 is a linear portion (i.e. portion with a considerably large radius of curvature) that exists on the side surface 85 in the cross-section of the second conductor line 82 in its width direction, and the flatness of the flat part 853 is 0.5 μm or less. In one or more embodiments, the flat part 853 is formed at approximately the entire area of the side surface 85. The shape of the flat part 853 is not particularly limited to the above and the flat part 853 may be formed at a part of the side surface 85.

From the viewpoint of suppressing the diffuse reflection of light at the side surface 85, an angle $\theta_2$ between the side surface 85 and the top surface 84 is 90° to 170° ($90° \leq \theta_2 \leq 170°$) or 90° to 120° ($90° \leq \theta_2 \leq 120°$). In one or more embodiments, in one second conductor line 82, the angle between one side surface 85 and the top surface 84 is substantially the same as the angle between the other side surface 85 and the top surface 84.

From the viewpoint of tightly fixing the second mesh-like electrode layer 81 and the second resin layer 7 to each other, the surface roughness of the contact surface 83 of the second mesh-like electrode layer 81 in one or more embodiments is relatively rougher than the surface roughness of the top surface 84. Since the top surface 84 includes the flat surface 841 in one or more embodiments, the above relative relationship of the surface roughness in the second conductor line 82 (relationship that the surface roughness of the contact surface 83 is relatively rougher than the surface roughness of the top surface 84) is established. Specific values of the surface roughness of the contact surface 83 and the surface roughness of the top surface 84 are similar to the above-described values of the surface roughness of the contact surface 63 and the surface roughness of the top surface 64. Specifically, the surface roughness Ra of the contact surface 83 of the second conductor line 82 is about 0.1 μm to 3.0 μm while the surface roughness Ra of the top surface 84 is about 0.001 μm to 1.0 μm. The surface roughness Ra of the contact surface 83 of the second conductor line 82 is 0.1 μm to 0.5 μm and the surface roughness Ra of the top surface 84 is 0.001 μm to 0.3 μm. The ratio of the surface roughness of the top surface 84 and the surface roughness of the contact surface 83 (ratio of the surface roughness of the top surface 84 to the surface roughness of the contact surface 83) is 0.01 or more and less than 1 or 0.1 or more and less than 1. The surface roughness of the top surface 84 is ⅕ or less of the width (maximum width) of the second conductor line 82. Measurement of the surface roughness of the upper surface 84 and the contact surface 83 may be performed along the width direction of the second conductor line 82 and may also be performed along the extending direction of the second conductor line 82.

In one or more embodiments, the side surface 85 includes the flat part 853. The surface roughness of the contact surface 83 is therefore relatively rougher than that of the side surface 85. Specifically, the surface roughness Ra of the contact surface 83 of the second conductor line 82 is 0.1 μm to 3 μm while the surface roughness Ra of the side surface 85 is 0.001 μm to 1.0 μm.

In one or more embodiments, the surface roughness of the contact surface 83 is relatively rougher than the surface roughness of the top surface 84 and side surfaces 85 and, therefore, the diffuse reflectance of the wiring body 4 at other surfaces than the contact surface 83 (i.e. at the top surface 84 and side surfaces 85) is relatively smaller than the diffuse reflectance of the wiring body 4 at the contact surface 83. The ratio of the diffuse reflectance of the wiring body 4 at other surfaces than the contact surface 83 and the diffuse reflectance of the wiring body 4 at the contact surface 83 (ratio of the diffuse reflectance of the wiring body 4 at other surfaces than the contact surface 83 to the diffuse reflectance of the wiring body 4 at the contact surface 83) is 0.1 or more and less than 1 or 0.3 or more and less than 1 from the viewpoint of improving the visibility of the wiring body 4.

An example of the shape of the second conductor line having the above-described relative relationship of the surface roughness between the contact surface and other surfaces than the contact surface may be the same as the shape of the first conductor lines 62B illustrated in FIG. 7. Although the illustration is omitted, the second conductor line is formed with the contact surface having an uneven shape in which a part of the conductive powder particles protrudes from the binder resin in the cross-section in the width direction and the top surface and side surfaces each having a smooth shape in which the binder resin gets into spaces between the conductive powder particles to cover the conductive powder particles. Thus, the surface roughness of the contact surface is relatively rougher than the surface roughness of the top surface. In addition, the surface roughness of the contact surface is relatively rougher than the surface roughness of the side surfaces.

The width and height of the second conductor line 82 can be set within the above-described ranges of the width and height of the first conductor line 62.

As illustrated in FIG. 5 and FIG. 6, the third resin layer 9 is formed on the second resin layer 7 so as to cover the second conductor layer 8. The third resin layer 9 serves as a protection layer that protects the second conductor layer 8 from external. Moreover, when the third resin layer 9 covers the second conductor layer 8, the occurrence of scattering or the like of light at the surface of the wiring body 4 is suppressed and the deterioration in visibility of the wiring body 4 can be further suppressed.

In one or more embodiments, the material which constitutes the third resin layer 9 has the same composition as that of the material which constitutes the first and second resin layers 5 and 7. Thus, the third resin layer 9 is constituted by the material having optical isotropy as in the first and second resin layers 5 and 7 and the birefringence for light incident on the wiring body 4 is therefore suppressed. Moreover, the refractive index of the material which constitutes the second resin layer 7 and the refractive index of the material which constitutes the third resin layer 9 are substantially the same and the occurrence of scattering or the like of light incident on the wiring body 4 can thereby be suppressed at the interface between the second and third resin layers 7 and 9.

In one or more embodiments, a following Expression (17) is established or a following Expression (18) is established:

$$H_3 < H_2 \tag{17}$$

and $$H_1 \leq H_3 < H_2 \tag{18}.$$

In the above Expressions (17) and (18), $H_3$ represents a height of the third resin layer 9. The height $H_3$ of the third resin layer 9 refers to a thickness (height) of portions of the third resin layer 9 which are interposed between the top surfaces 84 of the second conductor lines 82 and the surface of the third resin layer 9 opposite to the surface located at the second resin layer 7 side.

Specifically, the height $H_3$ of the third resin layer 9 is 1 μm or more and 180 μm or less (1 μm≤$H_3$≤180 μm).

The "third resin layer 9" in one or more embodiments corresponds to an example of the "third resin layer."

A method of manufacturing a wiring board in one or more embodiments will then be described. FIG. 8(a) to FIG. 8(e) and FIG. 9(a) to FIG. 9(k) are cross-sectional views illustrating a method of manufacturing a conductor-layer-equipped structure according one or more embodiments of the present invention.

First, a recessed plate 11 is prepared as illustrated in FIG. 8(a). The recessed plate 11 is formed with recesses 111 having shapes that correspond to the shape of the first conductor layer 6. Examples of a material that constitutes the recessed plate 11 include nickel, silicon, glasses such as silicon dioxide, organic silicas, glassy carbon, thermoplastic resin, and photo-curable resin.

The depth of portions of the recesses 111 corresponding to the first mesh-like electrode layers 61 is 100 nm to 100 μm, 500 nm to 10 μm, or preferably 500 nm to 5 μm. The width of the portions is 100 nm to 100 μm, 500 nm to 10 μm, or 500 nm to 5 μm.

The depth of portions of the recesses 111 corresponding to the lead wires 66 is the same or deeper than that for the first mesh-like electrode layers 61, that is, 100 nm to 500 μm, 500 nm to 100 μm, or 500 nm to 30 μm. The width of the portions is wider than that for the first mesh-like electrode layers 61, that is, 1 μm to 500 μm, 1 μm to 100 μm, or 1 μm to 30 μm. In one or more embodiments, the cross-sectional shapes of the recesses 111 are each formed in a tapered shape that narrows toward the bottom part.

To improve releasability, the surfaces of the recesses 111 are preliminarily formed with release layers (not illustrated) constituted of an appropriate material, such as a black lead-based material, silicone-based material, fluorine-based material, ceramic-based material, and aluminum-based material.

The recesses 111 of the above recessed plate 11 are filled with a conductive material 12. The conductive paste as described above may be used as such a conductive material 12.

Examples of a method of filling the recesses 111 of the recessed plate 11 with the conductive material 12 include a dispensing method, ink-jet method, and screen printing method. Another possible method may include coating with a conductive material, such as by a slit-coating method, bar-coating method, blade-coating method, dip-coating method, spray-coating method and spin-coating method, and then wiping, scratching, suctioning, peeling, washing, or blowing away the conductive material applied to other parts than the recesses 111. An appropriate method can be selected in accordance with the composition or the like of the conductive material and the shape or the like of the recessed plate.

Then, as illustrated in FIG. 8(b), the conductive material 12 which fills the recesses 111 of the recessed plate 11 is heated to form the first conductor layer 6. A heating condition for the conductive material 12 can be appropriately set in accordance with the composition or the like of the conductive material. Due to this heat treatment, the conductive material 12 undergoes volume contraction to slightly form uneven shapes on surfaces 121 of the conductive material 12. During this treatment, outer surfaces other than the upper surfaces of the conductive material 12 are formed into shapes that follow the recesses 111.

The treatment method for the conductive material 12 is not limited to heating. The conductive material 12 may be irradiated with energy rays, such as infrared rays, ultraviolet rays and laser light, or may be simply dried. Two or more treatment methods as the above may be employed in combination. The uneven shapes of the surfaces 121 increase the contact area between the first conductor layer 6 and the first resin layer 5 and the first conductor layer 6 can be more tightly fixed to the first resin layer 5.

Subsequently, to form the first resin layer 5 as illustrated in FIG. 8(c), a resin material 13 is applied onto the recessed plate 11 formed with the first conductor layer 6 (recessed plate 11 in the state illustrated in FIG. 8(b)). The above-described material which constitutes the first resin layer 5 can be used as such a resin material 13. Examples of a method of applying the resin material 13 onto the recessed plate 11 include a screen printing method, spray-coating method, bar-coating method, dip method, ink-jet method, and casting method.

In accordance with the characteristics of the first resin layer 5 to be formed, the viscosity of the resin material 13 may be adjusted and/or various additives may be mixed. In accordance with the characteristics of the first resin layer 5 to be formed, the resin material 13 may be mixed with some agent, such as a solvent and curing initiator, which is suitable for the curing treatment for the resin material 13. Examples of the characteristics of the first resin layer 5 include the thickness, resistance to ion migration, resistance to ultraviolet, and releasability of the first resin layer 5. Adjustment of the viscosity of the resin material 13 may be performed, such as by adjusting the content of a solvent to be mixed and adjusting the molecular weight in the raw material state of a unit structure that constitutes the main chain of the material which constitutes the resin material 13. A UV-curable resin that does not require a solvent may be used as the resin material 13 because the volume contraction is small during the process of forming the first resin layer 5.

Then, as illustrated in FIG. 8(d), a support base material 14 is disposed above the recessed plate 11 and pressed against the recessed plate 11 so that the resin material 13 gets into the recesses 111 of the recessed plate 11, and the resin material 13 is cured. In one or more embodiments, the curing treatment for the resin material 13 is performed by generating a chemical reaction (such as a polymerization reaction and crosslinking reaction) in the resin material 13. Examples of the method of curing the resin material 13 include irradiation with energy rays, such as ultraviolet rays, infrared rays and laser light, heating, heating and cooling, and drying. When performing the heating or irradiation with energy rays for curing the resin material 13, the heating method or irradiation method for the resin material 13 is appropriately set in accordance with the characteristics of the first resin layer 5 to be formed. The quantity of heat applied to the resin material 13 is appropriately set in accordance with the characteristics of the first resin layer 5 to be formed. The first resin layer 5 is thus formed.

Here, the support base material 14 is to provisionally support the wiring body 4, such as when conveying the wiring body 4, until the wiring body 4 is supported by at least one of the cover glass 31 and the liquid crystal panel 32. An appropriate material, such as polyethylene terephthalate (PET), polyolefin film, polyvinyl chloride (PVC), polyethylene (PE), polypropylene (PP), and polystyrene (PS), can be used as the material which constitutes the support base material 14. It suffices that the material which constitutes the support base material 14 has rigidity enough to provisionally support the wiring body 4. The material is not particularly limited to the above and it may be possible to employ a more inexpensive material.

Thus, in one or more embodiments, the function of supporting the wiring body 4 (specifically, the first and second conductor layers 6 and 8) is separated from the configuration of the wiring body 4 and it is thus possible to reduce the thickness of the wiring body 4 and suppress the deterioration in visibility due to the retardation value Re of the member which supports the electrode layers (i.e. the support base material 14 in one or more embodiments). Moreover, the production cost for the wiring body 4 can be reduced because an inexpensive material can be employed as the material which constitutes the support base material 14.

In one or more embodiments, from the viewpoint of suppressing the deterioration in visibility of the wiring body 4 and preventing the damage of the wiring body 4, a following Expression (19) is established:

$$0.01 \text{ N/cm} \leq N_1 \leq 1 \text{ N/cm} \quad (19).$$

In the above Expression (19), $N_1$ represents peel strength between the first resin layer 5 and the support base material 14. The peel strength in the present description can be measured in accordance with a JIS method (JIS Z0237).

When $N_1$ is less than the lower limit of the above Expression (19), the first resin layer 5 may unintentionally peel from the support base material 14 in the production process for the wiring body 4. When $N_1$ exceeds the upper limit of the above Expression (19), unduly large force has to be applied when the support base material 14 is removed from the support base material 14, and the support base material 14 may possibly be damaged. From the viewpoint of improving the removability of the support base material from the first resin layer 5, $N_1$ is 0.2 N/cm or less (0.01 N/cm≤$N_1$≤0.2 N/cm).

To achieve the above Expression (19), the support base material 14 of one or more embodiments is subjected to surface treatment such that a main surface of the support base material 14 at the side facing the main surface 42 of the wiring body 4 can be smooth. Specifically, the surface roughness Ra of the main surface of such a support base material 14 is 0.1 μm or less or 0.05 μm or less. The above surface roughness of the support base material 14 can be achieved by removing an additive and/or filler contained in the material which constitutes the support base material 14 and/or by reducing the size of the filler (filler diameter).

The scheme of achieving the above Expression (19) is not particularly limited to the above and another surface treatment may also be employed, such as performing a coating process of forming a coating layer on the main surface of the support base material 14. Examples of the material which constitutes the coating layer include a silicone-based material, fluorine-based material, black lead-based material, ceramic-based material, and aluminum-based material. The thickness of such a coating layer is 1 μm or less. Examples of a method of forming the coating layer on the main surface of the support base material 14 include a method of applying a coating liquid that contains the above-described material to the main surface of the support base material 14, then drying the coating liquid to cure it, and performing other steps if necessary.

The method of surface treatment for the support base material 14 is not limited to the above, provided that the above Expression (19) can be achieved. Any known method can be employed.

When a thermoset material is used as the resin material 13, the first resin layer 5 can be formed through adding various additives or the like to the resin material 13 to improve the flowability, performing flow casting using the above method, and then heating the resin material 13 thereby to generate a chemical reaction in the resin material 13.

Thus, in one or more embodiments, physical pressure is not applied (i.e., stretching is not performed) when the first resin layer 5 is formed and, therefore, orientation of molecules due to stretching does not occur. This allows the first resin layer 5 to have optical isotropy, and the deterioration in visibility of the wiring body 4 including the first resin layer 5 can be suppressed.

As will be understood, the method of forming the first resin layer 5 is not limited to the above. For example, the first resin layer 5 may be formed through preparing the support base material 14 on which the resin material 13 for forming the first resin layer 5 is approximately uniformly applied and curing the resin material 13 in a state in which the support base material 14 is pressed against the recessed plate 11 so that the resin material 13 gets into the recesses 111 of the recessed plate 11.

Subsequently, as illustrated in FIG. 8(e), the support base material 14, the first resin layer 5, and the first conductor layer 6 are released from the recessed plate and a first intermediate body 1 is thus obtained.

Next, a recessed plate 16 is prepared as illustrated in FIG. 9(a). The recessed plate 16 is formed with recesses 161 having shapes that correspond to the shape of the second conductor layer 8. The same material as that for constituting the recessed plate 11 can be exemplified as a material that constitutes the recessed plate 16. The shapes of the recesses 161 formed in the recessed plate 16 correspond to the second conductor layer 8, but the depths and widths of the recesses 161 have the same values as those of the above-described recesses 111 because the second conductor layer 8 has a similar configuration to that of the first conductor layer 6.

To improve releasability, the surfaces of the recesses 161, like the recesses 111, are preliminarily formed with release layers (not illustrated) constituted of an appropriate material, such as a black lead-based material, silicone-based material, fluorine-based material, ceramic-based material, and aluminum-based material.

The recesses 161 of the above recessed plate 16 are filled with a conductive material 17. The same material as that for the conductive material 12 can be exemplified as such a conductive material 17. The same method as that for filling the recesses 111 of the recessed plate 11 with the conductive material 12 can be used as a method for filling the recesses 161 of the recessed plate 16 with the conductive material 17.

Then, as illustrated in FIG. 9(b), the conductive material 17 which fills the recesses 161 of the recessed plate 16 is heated to form the second conductor layer 8. A heating condition for the conductive material 17 can be appropriately set in accordance with the composition or the like of the conductive material. Due to this heat treatment, the conductive material 17 undergoes volume contraction to slightly form uneven shapes on surfaces 171 of the conductive material 17. During this treatment, outer surfaces other than the upper surfaces of the conductive material 17 are formed into shapes that follow the recesses 161.

The uneven shapes of the surfaces 171 increase the contact area between the second conductor layer 8 and the second resin layer 7 and the second conductor layer 8 can be more tightly fixed to the second resin layer 7. As in the case of the conductive material 12, the treatment method for the conductive material 17 is not limited to heating.

Subsequently, to form the second resin layer 7 as illustrated in FIG. 9(c), a resin material 18 is applied onto the first intermediate body 15. The above-described material which constitutes the second resin layer 7 can be used as such a resin material 18, but in one or more embodiments, a material having the same composition as that of the above-described material selected for the resin material 13 is used.

In accordance with the characteristics of the second resin layer 7 to be formed, the viscosity of the resin material 18 may be adjusted and/or various additives may be mixed. In accordance with the characteristics of the second resin layer 7 to be formed, the resin material 18 may be mixed with some agent, such as a solvent and curing initiator, which is suitable for the curing treatment for the resin material 18. The characteristics of the second resin layer 7 may be the same as those of the first resin layer 5. The same method as that of adjusting the viscosity of the resin material 13 can be used as the method of adjusting the viscosity of the resin material 18. A UV-curable resin that does not require a solvent may be used as the resin material 18 because the volume contraction is small during the process of forming the second resin layer 7.

In one or more embodiments, an additive, solvent, and curing initiator mixed in the resin material 13 may be different from an additive, solvent, and curing initiator mixed in the resin material 18. In the present description, the situation that the material which constitutes the first resin layer 5 and the material which constitutes the second resin layer 7 have the same composition is determined in accordance with a state after the first and second resin layers 5 and 7 are formed, regardless of whether the composition of the resin material 13 and the composition of the resin material 18 are different.

From the viewpoint of ensuring sufficient flowability during the application, the viscosity of the material which constitutes the second resin layer 7 is 1 mPa·s to 10,000 mPa·s. From the viewpoint of durability of the first conductor layer 6 and the second conductor layer 8, the storage elastic modulus of the resin after curing is $10^6$ Pa or more and $10^9$ Pa or less. Examples of a method of applying the resin material 18 onto the first intermediate body 15 include a screen printing method, spray-coating method, bar-coating method, dip method, ink-jet method, and casting method.

Here, in one or more embodiments, the first resin layer 5 which constitutes the first intermediate body 15 is cured by generating a chemical reaction in the resin material 13. The resin material 13 and the material which constitutes the first resin layer 5 therefore have different main skeletons. In addition, the molecular weight of the resin material 13 and the molecular weight of the material which constitutes the first resin layer 5 are different. In this case, even though the resin material 18 having the same composition as that of the resin material 13 is applied onto the first intermediate body 15 (specifically, the first resin layer 5), the first resin layer 5 is not eroded by the solvent and the like contained in the resin material 18. Moreover, the first resin layer 5 does not deform by heat due to the quantity of heat of the resin material 18.

Then, as illustrated in FIG. 9(d), the first intermediate body 15 and the recessed plate 16 are disposed on the recessed plate 16 so that the resin material 18 gets into the recesses 161 of the recessed plate 16, the first intermediate body 15 is pressed against the recessed plate 16, and the resin material 18 is cured. The pressing pressure when pressing the first intermediate body 15 against the recessed plate 16 is 0.001 MPa to 100 MPa or 0.01 MPa to 10 MPa. The pressing can be performed, such as using pressure rollers. Thus, the second resin layer 7 is formed, and the first intermediate body 15 and the second conductor layer 8 adhere to and are fixed to each other via the second resin layer 7.

In one or more embodiments, the curing treatment for the resin material 18 is performed by generating a chemical reaction in the resin material 18. Examples of the method of curing the resin material 18 include irradiation with energy rays, such as ultraviolet rays, infrared rays and laser light, heating, heating and cooling, and drying. The second resin layer 7 is thus formed. As in the first resin layer 5, orientation of molecules does not occur because physical pressure is not applied to the second resin layer 7 when forming it. This allows the second resin layer 7 to have optical isotropy, and the deterioration in visibility of the wiring body 4 including the second resin layer 7 is suppressed.

In one or more embodiments, a chemical reaction (cross-linking reaction) occurs between the resin material 18 and functional groups of the material which constitutes the first resin layer 5 during the process of pressing the first intermediate body 15 against the resin material 18 and curing the resin material 18. The first resin layer 5 and the second resin layer 7 are therefore brought into a state of being chemically bonded together. The first resin layer 5 and the second resin layer 7 may also be bonded to each other due to intermolecular force and/or anchor effect between the resin layers 5 and 7 in addition to the above-described chemical bond.

Then, as illustrated in FIG. 9(e), the first intermediate body 15, the second resin layer 7, and the second conductor layer 8 are released from the recessed plate 16 and a second intermediate body 19 is thus obtained.

Subsequently, to form the third resin layer 9 as illustrated in FIG. 9(f), a resin material 20 is applied onto the second intermediate body 19. The above-described material which constitutes the third resin layer 9 can be used as such a resin material 20, but in one or more embodiments, a material having the same composition as that of the above-described material selected for the resin materials 13 and 18 is used.

In accordance with the characteristics of the third resin layer 9 to be formed, the viscosity of the resin material 20 may be adjusted and/or various additives may be mixed. In accordance with the characteristics of the third resin layer 9 to be formed, the resin material 20 may be mixed with some agent, such as a solvent and curing initiator, which is suitable for the curing treatment for the resin material 20. The characteristics of the third resin layer 9 may be the same as those of the first resin layer 5. The same method as that of adjusting the viscosity of the resin material 13 can be used as the method of adjusting the viscosity of the resin material 20. A UV-curable resin that does not require a solvent may be used as the resin material 20 because the volume contraction is small during the process of forming the third resin layer 9.

Additives, solvents, curing initiators, and the like to be mixed may be different between the resin materials 13 and 18 and the resin material 20. In the present description, the situation that the material which constitutes the first resin layer 5 or the material which constitutes the second resin layer 7 and the material which constitutes the third resin layer 9 have the same composition is determined in accordance with a state after the first to third resin layers 5, 7, and 9 are formed, regardless of whether the composition of the resin materials 13 and 18 and the composition of the resin material 20 are different.

From the viewpoint of ensuring sufficient flowability during the application, the viscosity of the material which constitutes the third resin layer 9 is 1 mPa·s to 10,000 mPa·s. From the viewpoint of durability of the second conductor layer 8, the storage elastic modulus of the resin after curing is $10^6$ Pa or more and $10^9$ Pa or less. Examples of a method of applying the resin material 20 onto the second intermediate body 19 include a screen printing method, spray-coating method, bar-coating method, dip method, ink-jet method, and casting method.

Here, in one or more embodiments, the second resin layer 7 which constitutes the second intermediate body 19 is cured by generating a chemical reaction in the resin material 18. The resin material 18 and the material which constitutes the second resin layer 7 therefore have different main skeletons. In addition, the molecular weight of the resin material 18 and the molecular weight of the material which constitutes the second resin layer 7 are different. In this case, even though the resin material 20 having the same composition as that of the resin material 18 is applied onto the second intermediate body 19 (specifically, the second resin layer 7), the second resin layer 7 is not eroded by the solvent and the like contained in the resin material 20. Moreover, the second resin layer 7 does not deform by heat due to the quantity of heat of the resin material 20.

Then, the resin material 20 is cured to form the third resin layer 9. In one or more embodiments, the curing treatment for the resin material 20 is performed by generating a chemical reaction in the resin material 20. Examples of the method of curing the resin material 20 include irradiation with energy rays, such as ultraviolet rays, infrared rays and laser light, heating, heating and cooling, and drying. As in the first and second resin layers 5 and 7, orientation of molecules does not occur because physical pressure is not applied to the third resin layer 9 when forming it. This allows the third resin layer 9 to have optical isotropy, and the deterioration in visibility of the wiring body 4 including the third resin layer 9 is suppressed.

Subsequently, as illustrated in FIG. 9(g), an adhesive material 21 that constitutes the first adhesion layer 101 is applied onto the cover glass 31. Examples of such an adhesive material 21 include an acrylic resin, urethane resin, and polyester resin. Examples of a method of applying the adhesive material 21 onto the cover glass 31 include a screen printing method, spray-coating method, bar-coating method, dip method, ink-jet method, and casting method.

Then, as illustrated in FIG. 9(h), the second intermediate body 19 is pressed against the cover glass 31 in a state in which the adhesive material 21 is interposed between the second intermediate body 19 and the cover glass 31, and the adhesive material 21 is cured. Examples of the method of curing the adhesive material 21 include irradiation with energy rays, such as ultraviolet rays, infrared rays and laser light, heating, heating and cooling, and drying. The first adhesion layer 101 is thus formed. The cover glass 31 adheres to the main surface 41 of the wiring body 4 via the first adhesion layer 101. The wiring body 4 is supported by the cover glass 31 from the main surface 41 side.

Then, as illustrated in FIG. 9(i), the support base material 14 is removed to expose the main surface 42 of the wiring body 4 (first resin layer 5). Even when the support base material 14 is removed from the wiring body 4, the possibility of damage of the wiring body 4 is low because the wiring body 4 is supported by the cover glass 31 via the first adhesion layer 101. As will be understood, the timing of removing the support base material 14 is not particularly limited to the above. For example, the support base material 14 may be removed after the third resin layer 9 is formed (FIG. 9(f)). In this case, the support base material 14 is removed before the cover glass 31 is provided on the main surface 41 of the wiring body 4.

Then, as illustrated in FIG. 9(j), an adhesive material 22 that constitutes the second adhesion layer 102 is applied onto the main surface 321 of the liquid crystal panel 32. The same material as the above-described adhesive material 21 may be used as such an adhesive material 22. The same method as that of applying the above-described adhesive material 21 onto the cover glass 31 may be used as the method of applying the adhesive material 22 onto the liquid crystal panel 32.

Then, as illustrated in FIG. 9(k), the second intermediate body 19 is pressed against the liquid crystal panel 32 in a state in which the adhesive material 22 is interposed between the second intermediate body 19 and the liquid crystal panel 32, and the adhesive material 22 is cured. The same method as that of curing the above-described adhesive material 21 may be used as the method of curing the adhesive material 22. The second adhesion layer 102 is thus formed. The liquid crystal panel 32 is provided on the main surface 42 of the wiring body 4 via the second adhesion layer 102. The conductor-layer-equipped structure 2 can be obtained in the above manner.

The conductor-layer-equipped structure 2 of one or more embodiments has the following effects.

Conventionally, a touch position detecting mechanism using a capacitance scheme is used which is constituted of a base material and two electrode layers formed on both main surfaces of the base material. When such a touch position detecting mechanism is employed to manufacture a touch panel, the material which constitutes the base material has to be selected so as to ensure the rigidity enough to support the two electrode layers. It is therefore difficult to reduce the thickness (height) of the base material because the base material has to support the two electrode layers. As a result, the touch panel cannot be made thin. In addition, a material formed by stretching a resin material and thus having birefringence is generally used as such a base material. In this case, interference color and the like occur on the image display surface of the touch panel due to the phase difference of light transmitting through the base material, and the visibility of the touch panel may deteriorate. It can be considered to suppress the above-described deterioration in visibility by employing a material having optical isotropy and thus having a small retardation value or by employing a material having optical anisotropy and thus having a large retardation value (i.e. a material with large birefringence). When such a material having a small or large retardation value is used, however, the production cost may increase.

Conventionally-used materials having optical isotropy include cellulose triacetate, polycarbonate, and cycloolefin. The two electrode layers which constitute the touch position detecting mechanism are each constituted of an electrode and a resin layer that supports the electrode. When the conventional material having optical isotropy is employed as each resin layer and the two resin layers are laid, these materials are preliminarily formed into film-like shapes and the two resin layers have to be bonded together using an adhesive material. The materials which constitute the resin layers and the adhesive material therefore have different compositions, and the difference of refractive index between the materials which constitute the resin layers and the adhesive material may cause scattering or the like of incident light to deteriorate the visibility of the tough position detecting mechanism. In addition, the above-described conventional materials having optical isotropy are not cross-linked and thus have a relatively large coefficient of thermal expansion, and the dimensional accuracy against a temperature change is poor. Moreover, since the above-described conventional materials having optical isotropy are not cross-linked, the strength and hardness of the resin layers constituted of such materials are relatively poor. Furthermore, the above-described conventional materials having optical isotropy are soluble in an organic solvent and, therefore, the material which constitutes one resin layer may erode and/or thermally deform the other resin layer. Thus, the two resin layers cannot be laid on each other.

In contrast, in one or more embodiments, the birefringence for light incident on the wiring body 4 is suppressed because the material which constitutes the first resin layer 5 and the material which constitutes the second resin layer 7 have the same composition and thus have optical isotropy. This can suppress the deterioration in visibility of the conductor-layer-equipped structure 2. Moreover, the use of expensive materials is not necessary for the first and second resin layers 5 and 7 and the cost can be reduced.

In one or more embodiments, the first conductor layer 6 is supported by the first resin layer 5, and a base material or the like for supporting the first conductor layer 6 is therefore not necessary. The deterioration in visibility of the conductor-layer-equipped structure 2 can thus be suppressed and the conductor-layer-equipped structure 2 can be made thin.

In the conductor-layer-equipped structure 2 of one or more embodiments, the cover glass 31 is provided at one main surface 41 side of the wiring body 4, the liquid crystal panel 32 is provided at the other main surface 42 side of the wiring body 4, and the wiring body 4 is supported by at least one of the cover glass 31 and the liquid crystal panel 32. Only the first adhesion layer 101 is interposed between the cover glass 31 and the one main surface 41 of the wiring body 4, and other configuration such as a base material is not present there. In addition, only the second adhesion layer 102 is interposed between the liquid crystal panel 32 and the other main surface 42 of the wiring body 4, and other configuration such as a base material is not present there. Thus, in one or more embodiments, the deterioration in visibility of the conductor-layer-equipped structure 2 can be suppressed and the conductor-layer-equipped structure 2 can be made thin because a base material or the like that adheres directly to the wiring body 4 to support it is not used.

JP2014-191717A discloses a touch panel in which conductor layers such as a primer layer and sensor electrode are formed on a printing base material (support base material). However, the touch panel cannot be made thin because of having the printing base material. In addition, the base material having optical isotropy is expensive and disadvantageous in reducing the cost. In contrast, such a printing material is not used in one or more embodiments. The touch panel can therefore be made thin and the visibility can be improved.

In a conventional wiring body, conductive compositions for obtaining sensor electrodes and the like are cured on the support base material. The support base material therefore cannot be cleanly removed from the wiring body because the support base material and the insulating resin are burnt in and/or the support base material deforms. Thus, the conductor-layer-equipped structure 2 (wiring body 4) cannot be obtained without using the support base material 14.

In one or more embodiments, the refractive index N1 of the material which constitutes the first resin layer 5 and the refractive index N2 of the material which constitutes the second resin layer 7 are substantially the same because the material which constitutes the first resin layer 5 and the material which constitutes the second resin layer 7 have the same composition. This can suppress the occurrence of scattering or the like of light incident on the wiring body 4 at the interface between the first and second resin layers 5 and 7, and the deterioration in visibility of the conductor-layer-equipped structure 2 can be suppressed.

In one or more embodiments, the material which constitutes the first resin layer 5 and the material which constitutes the second resin layer 7 have the same composition, and the coefficient of thermal expansion can thereby be substantially the same between these resin layers 5 and 7. The degree of change in dimension (e.g. amount of change and direction of change) can therefore be substantially the same between the first and second resin layers 5 and 7. This can prevent the occurrence of misalignment between the first mesh-like electrode layers 61 located on the first resin layer 5 and the second mesh-like electrode layers 81 located on the second resin layer 7. It is thus possible to suppress the deterioration in visibility of the conductor-layer-equipped structure 2 due to unevenness of overlapping portions between the first and second mesh-like electrode layers 61 and 81 in the plan view.

Provided that the material which constitutes the first resin layer 5 and the material which constitutes the second resin layer 7 have the same composition, when one or more substituent groups or functional groups that constitute a side chain of the material which constitutes the first resin layer 5 are all included in a side chain of the material which constitutes the second resin layer 7 and one or more substituent groups or functional groups that constitute the side chain of the material which constitutes the second resin layer 7 are all included in the side chain of the material which constitutes the first resin layer 5, the refractive index N1 of the material which constitutes the first resin layer 5 and the refractive index N2 of the material which constitutes the second resin layer 7 can be more identical with each other, and the coefficient of thermal expansion of the material which constitutes the first resin layer 5 and the coefficient of thermal expansion of the material which constitutes the second resin layer 7 can also be more identical with each other. This can further suppress the occurrence of scattering or the like of light incident on the wiring body 4 at the interface between the first and second resin layers 5 and 7 and can also further suppress the occurrence of unevenness of overlapping portions between the first and second mesh-like electrode layers 61 and 81. As a result, the deterioration in visibility of the conductor-layer-equipped structure 2 can be further suppressed.

Provided that the material which constitutes the first resin layer 5 and the material which constitutes the second resin layer 7 have the same composition, when the average molecular weight of the material which constitutes the first resin layer 5 and the average molecular weight of the material which constitutes the second resin layer 7 are substantially the same, the refractive index N1 of the material which constitutes the first resin layer 5 and the refractive index N2 of the material which constitutes the second resin layer 7 can be more identical with each other, and the coefficient of thermal expansion of the material which constitutes the first resin layer 5 and the coefficient of thermal expansion of the material which constitutes the second resin layer 7 can also be more identical with each other. This can further suppress the occurrence of scattering or the like of light incident on the wiring body 4 at the interface between the first and second resin layers 5 and 7 and can also further suppress the occurrence of unevenness of overlapping portions between the first and second mesh-like electrode layers 61 and 81. As a result, the deterioration in visibility of the conductor-layer-equipped structure 2 can be further suppressed.

In one or more embodiments, curing treatment is performed by generating a chemical reaction in the resin material 13 to form the first resin layer 5. In this case, the resin material 13 and the material which constitutes the first resin layer 5 have different main skeletons, and the molecular weight of the resin material 13 and the molecular weight of the material which constitutes the first resin layer 5 are different. Accordingly, even though the resin material 18 having the same composition as that of the resin material 13 is applied onto the first intermediate body 15, the first resin layer 5 is not eroded by the solvent and the like contained in the resin material 18. Moreover, the first resin layer 5 does not deform by heat due to the quantity of heat of the resin material 18.

In one or more embodiments, the above Expressions (8) and (12) are established and it is thus possible to reduce the difference between the refractive index of the material which constitutes the above-described cover glass 31 and the refractive indices of the first and second resin layers 5 and 7. The occurrence of scattering or the like of light incident on the conductor-layer-equipped structure 2 can therefore be suppressed. This can suppress the deterioration in visibility of the conductor-layer-equipped structure 2.

In one or more embodiments, the above Expressions (9) and (13) are established and the light incident on the wiring body 4 is thus unlikely to reduce its amount of transmitted light. This can further suppress the deterioration in visibility of the conductor-layer-equipped structure 2.

In one or more embodiments, the above Expression (10) is established and the conductor-layer-equipped structure 2 can thus be made thin.

In one or more embodiments, the surface roughness of the contact surfaces 63 and 83 are relatively rougher than the surface roughness of the top surfaces 64 and 84. The first mesh-like electrode layers 61 and the first resin layer 5, or the second mesh-like electrode layers 81 and the second resin layer 7, can thus be tightly fixed to each other.

In one or more embodiments, the material which constitutes the third resin layer 9 has the same composition as that of the material which constitutes the first and second resin layers 5 and 7, and the third resin layer 9 is thus constituted of the material having optical isotropy. The birefringence for light incident on the wiring body 4 is therefore suppressed. This can further suppress the deterioration in visibility of the conductor-layer-equipped structure 2.

Moreover, the refractive index of the material which constitutes the second resin layer 7 and the refractive index of the material which constitutes the third resin layer 9 are substantially the same, and the occurrence of scattering or the like of light incident on the wiring body 4 can therefore be suppressed at the interface between the second and third resin layers 7 and 9. It is thus possible to suppress the deterioration in visibility of the conductor-layer-equipped structure 2.

In one or more embodiments, the wiring body 4 satisfies the above Expression (15) and the distance between the first conductor lines 62 and the second conductor lines 82 is thus long. The electric characteristics can therefore be prevented from deteriorating and the wiring body 4 can normally function as a wiring body having two or more conductive layers. Moreover, the film thickness of the entire wiring body 4 (input device or wiring board 1) can be thin because the first resin layer 5 is thicker than the second resin layer 7. In particular, when the wiring body 4 of one or more embodiments is used in a touch sensor, contact with a contact body such as a finger allows the touch sensor to appropriately react to the contact body because the lines of electric force released can be prevented from being closed between the first conductor lines 62 and the second conductor lines 82. This results in improved ability of detection. Furthermore, a reduced film thickness of the conductor-layer-equipped structure 2 as a whole can improve the optical transparency.

In one or more embodiments, the wiring body 4 satisfies the above Expression (16) and the thickness $H_2$ of the second resin layer 7 can thus be prevented from being unduly thick beyond necessity. The film thickness of the conductor-layer-equipped structure 2 as a whole can therefore by made thin.

In one or more embodiments, the wiring body 4 satisfies the above

Expression (17) and the entire film thickness can thus be made thin even when the third resin layer 9 is provided. In particular, when the conductor-layer-equipped structure 2 is used in a touch panel, the optical transparency can also be improved.

In the wiring body 4 of one or more embodiments, attention is also focused on the relative relationship of the surface roughness (i.e. the roughness parameter obtained by shutting off the waviness components) between the adhesion surfaces in the first conductor layer 6 and other surfaces than the adhesion surfaces. This will be described with reference to each first conductor line 62 as an example. In one or more embodiments, the surface roughness Ra of the contact surface 63 of the first conductor line 62 is relatively rougher than the surface roughness of other surfaces (surfaces including the top surface 64 and side surfaces 65 of the first conductor line 62). This can suppress the diffuse reflection of incident light from external while allowing the first conductor line 62 and the first resin layer 5 to tightly adhere to each other. In particular, when the width of the conductor line 62 is 1 μm to 5 μm, a remarkable effect can be obtained that the relative relationship of the surface roughness between the adhesion surface and other surfaces can satisfy the above-described relationship thereby to suppress the diffuse reflection of incident light from external while allowing the first resin layer 5 and the first conductor line 62 to tightly adhere to each other.

In one or more embodiments, the side surface 65 extends so as to substantially coincide with the virtual line passing through the first and second portions 651 and 652. In this case, the side surface is not in a shape that is depressed inside the virtual straight line in the cross-section of the constitutional element of the first conductor layer in its width direction (i.e. not in a shape in which the lower part of the conductor pattern widens in a divergent fashion). The diffuse reflection of incident light from external of the conductor-layer-equipped structure 2 is therefore suppressed. When such a wiring body 4 is equipped in a touch panel or the like, the visibility of the touch panel or the like can be further improved.

In one or more embodiments, the surface roughness Ra of the contact surface 63 is relatively rougher than the surface roughness Ra of other surfaces than the contact surface 63 and, accordingly, the diffuse reflectance of the wiring body 4 at the other surfaces is relatively smaller than the diffuse reflectance of the wiring body 4 at the contact surface 63. Here, when the diffuse reflectance of the wiring body 4 is small, the first conductor line 62 can be avoided from being reflected to be white and the contrast degradation can be suppressed in a region in which the first conductor line 62 is visible. It is thus possible to further improve the visibility of a touch panel or the like equipped with the wiring body 4 of one or more embodiments. As will be understood, the above action and effect in one or more embodiments can also be obtained in the second conductor layer 8 because the contact surface 83 in the second conductor layer 8 is relatively rougher as compared with the surface roughness of other surfaces than the contact surface 83.

In the conductor-layer-equipped structure 2 of one or more embodiments, the adhesion layer 101 is interposed between the cover glass 31 and the third resin layer 9. That is, the wiring body 4 is disposed such that the second resin layer 7 is located at the side approaching the cover glass 31 with respect to the first resin layer 5. Accordingly, relatively smooth surfaces of outer shapes of the first and second conductor lines 62 and 82 which constitute the first and second mesh-like electrode layers 61 and 81 are arranged to face the cover glass 31 side, and the occurrence of scattering or the like of incident light from the cover glass 31 side can thus be suppressed.

Figure 10:
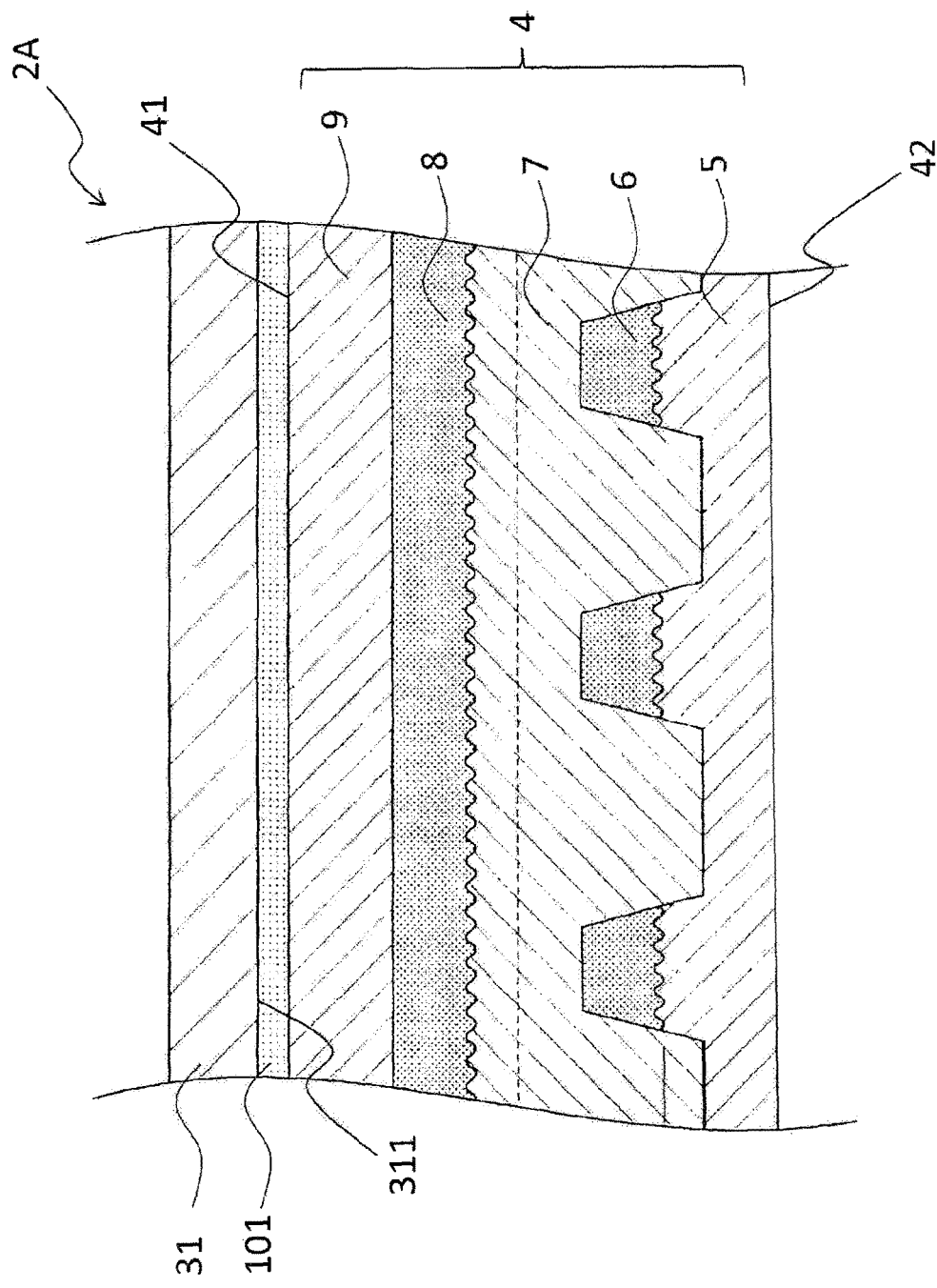
FIG. 10 is a cross-sectional view illustrating a conductor-layer-equipped structure according to one or more embodiments of the present invention.

FIG. 10 is a cross-sectional view illustrating a conductor-layer-equipped structure according to one or more embodiments of the present invention. Similar elements to those of the above-described embodiments are denoted by the same reference numerals and the description in the above-described embodiments will be borrowed herein to omit repetition of the description.

As illustrated in FIG. 10, the conductor-layer-equipped structure 2A according to one or more embodiments comprises a cover glass 31, a wiring body 4, and a first adhesion layer 101.

The cover glass 31 supports the wiring body 4 from the side of one main surface 41 of the wiring body 4 via the first adhesion layer 101. The cover glass 31 covers the entire main surface 41 of the wiring body 4, and the main surface 41 of the wiring body 4 is not exposed to external.

The first adhesion layer 101 is interposed between the cover glass 31 and the wiring body 4. The first adhesion layer 101 adheres directly to a main surface 311 of the cover glass 31 and also adheres directly to the main surface 41 of the wiring body 4 (specifically, third resin layer 9). Only the first adhesion layer 101 is interposed between the cover glass 31 and the wiring body 4 and other configuration such as a base material is not present there. The other main surface 42 of the wiring body 4 is exposed to external of the conductor-layer-equipped structure 2A.

In the conductor-layer-equipped structure 2A of one or more embodiments, the possibility of damage of the wiring body 4 is low because it is supported by the cover glass 31. The other main surface 42 of the wiring body 4 can therefore remain exposed without using a base material. This can suppress the deterioration in visibility of the conductor-layer-equipped structure 2, and the conductor-layer-equipped structure 2 can be made thin.

Figure 11:
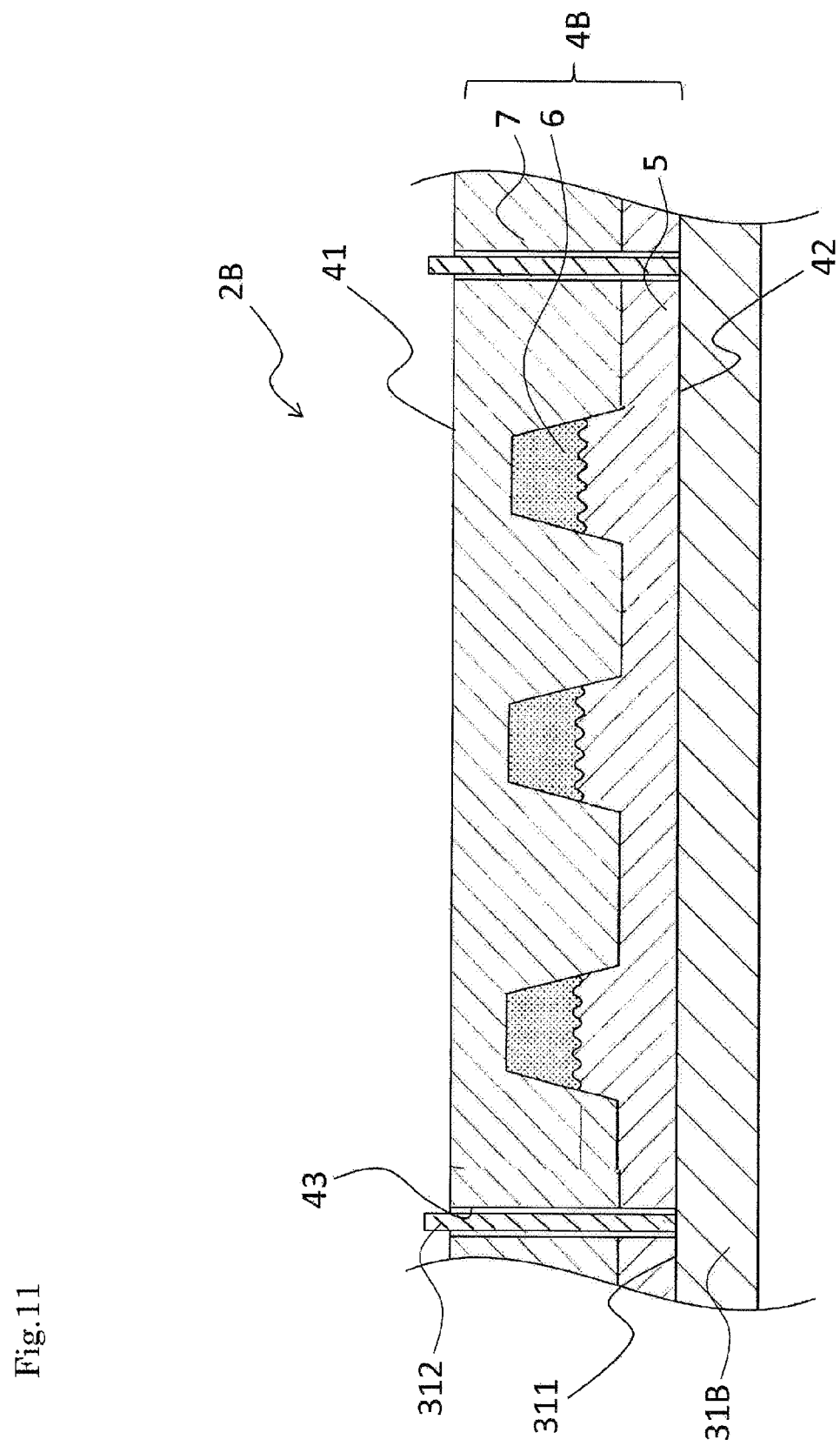
FIG. 11 is a cross-sectional view illustrating a conductor-layer-equipped structure according to one or more embodiments of the present invention.

FIG. 11 is a cross-sectional view illustrating a conductor-layer-equipped structure according to one or more embodiments of the present invention. Similar elements to those of the above-described embodiments are denoted by the same reference numerals and the description in the above-described embodiments will be borrowed herein to omit repetition of the description.

As illustrated in FIG. 11, the conductor-layer-equipped structure 2B of one or more embodiments comprises a support body 31B and a wiring body 4B. The wiring body 4B comprises a first resin layer 5, a first conductor layer 6, and a second resin layer 7. One main surface 41 of the wiring body 4B is constituted by the second resin layer 7. The other main surface 42 of the wiring body 4B is constituted by the first resin layer 5.

The support body 31B is, for example, a plate-like member that constitutes the bottom surface of a housing (not illustrated) storing the wiring body 4B. It suffices that the support body 31B has rigidity enough to support the wiring body 4B. Although not particularly limited, the support body 31B is constituted by a print wiring board, heat dissipating plate, housing, or the like. The support body 31B is provided with a plurality of positioning pins 312 for holding the position of the wiring body 4B without misalignment. The positioning pins 312 are provided to stand along the Z-direction from a main surface 311B of the support body 31B.

A plurality of positioning holes 43 is formed in the vicinity of the outer edge of the wiring body 4B. The positioning pins 312 are inserted in the positioning holes 43. The positioning holes 43 are opened at both main surfaces 41 and 42 of the wiring body 4B and pass through the wiring body 4B along the Z-direction. In the conductor-layer-equipped structure 2B of one or more embodiments, the wiring body 4B is placed on the support body 31B in a state in which the positioning pins 312 are disposed in the positioning holes 43. The main surface 311B of the support body 31B and the main surface 42 of the wiring body 4B are merely in direct contact with each other and do not adhere to each other. In the present description, the situation that a support body and a wiring body are in contact with each other refers to a state in which the support body and the wiring body do not adhere to each other and are separable if not being fixed. The main surface 41 of the wiring body 4B is exposed to external of the conductor-layer-equipped structure 2B. Other configuration such as a base material is not provided on the main surface 41 of the wiring body 4B. The "support body 31B" in one or more embodiments corresponds to an example of the "support body".

In the conductor-layer-equipped structure 2B of one or more embodiments, the possibility of damage of the wiring body 4B is low because it is supported by the support body 31B. Thus, in one or more embodiments, the deterioration in visibility of the conductor-layer-equipped structure 2B can be suppressed and the conductor-layer-equipped structure 2B can be made thin because the use of a base material or the like that adheres directly to the wiring body 4B to support it is not necessary.

Figure 12:
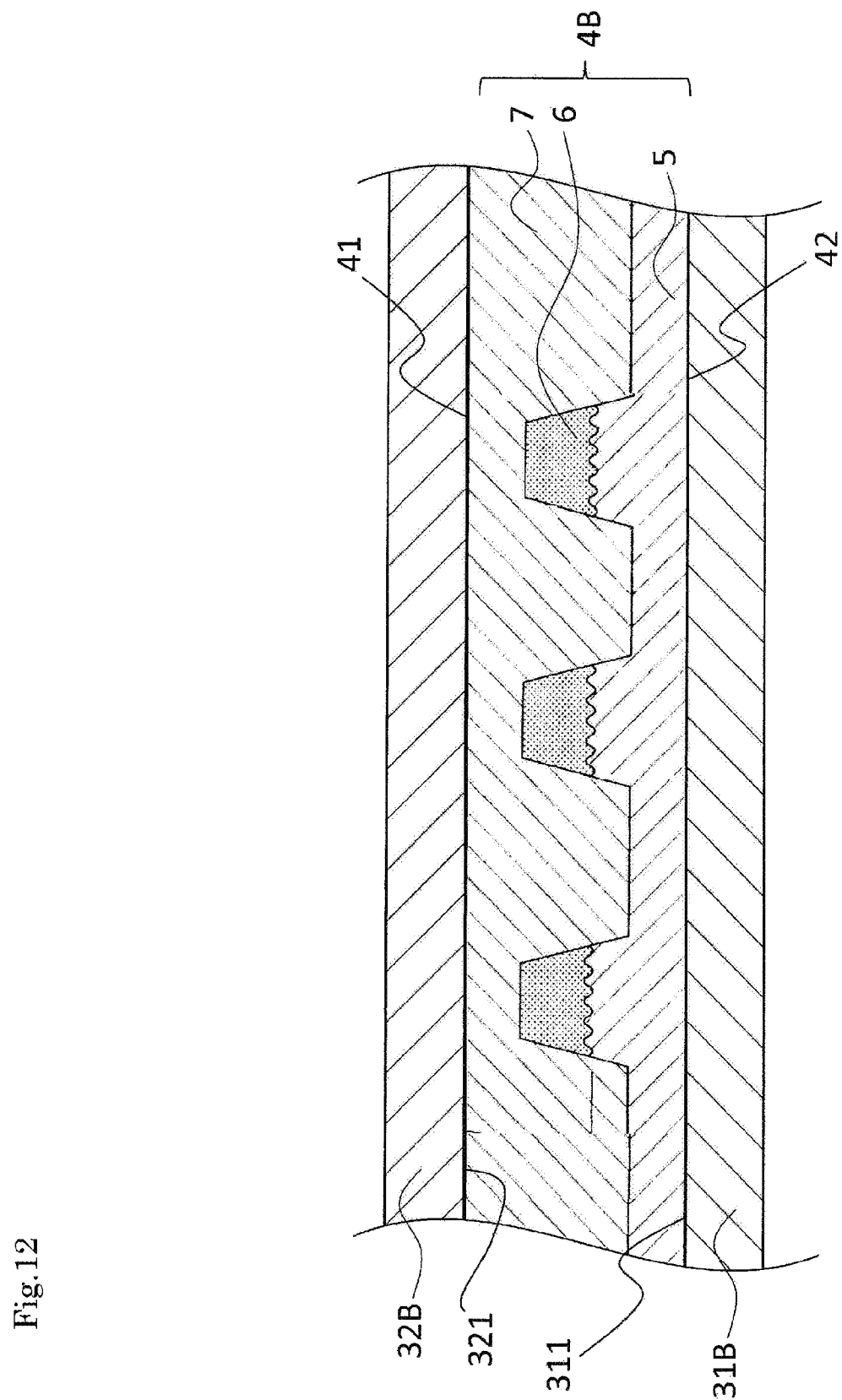
FIG. 12 is a cross-sectional view illustrating a conductor-layer-equipped structure according to one or more embodiments of the present invention.

FIG. 12 is a cross-sectional view illustrating a conductor-layer-equipped structure according to one or more embodiments of the present invention. Similar elements to those of the above-described embodiments are denoted by the same reference numerals and the description in the above-described embodiments will be borrowed herein to omit repetition of the description.

As illustrated in FIG. 12, the conductor-layer-equipped structure 2C of one or more embodiments comprises a support body 31B, a board 32B, and a wiring body 4B.

The board 32B is a plate-like member placed on the wiring body 4B. Although not particularly limited, such a board 32B is constituted by a print wiring board, heat dissipating plate, housing, cover member, or the like. At least one of the support body 31B and the board 32B has a portion having translucency.

In the conductor-layer-equipped structure 2C of one or more embodiments, the wiring body 4B is interposed between the support body 31B and the board 32B. A main surface 311B of the support body 31B and a main surface 42 of the wiring body 4B are merely in direct contact with each other and do not adhere to each other. A main surface 321B of the board 32B and a main surface 41 of the wiring body 4B are merely in direct contact with each other and do not adhere to each other. The "board 32B" in one or more embodiments corresponds to an example of the "board".

When the wiring body 4B and the support body 31B are merely in direct contact with each other and do not adhere to each other and the wiring body 4B and the board 32B are merely in direct contact with each other and do not adhere to each other, the side located at the lower side in the vertical direction with reference to the wiring body 4B constitutes the support body while the side located at the upper side in the vertical direction with reference to the wiring body 4B constitutes the board.

In the conductor-layer-equipped structure 2C of one or more embodiments, the possibility of damage of the wiring body 4B is low because it is interposed between the support body 31B and the board 32B. Thus, in one or more embodiments, the deterioration in visibility of the conductor-layer-equipped structure 2C can be suppressed and the conductor-layer-equipped structure 2C can be made thin because the use of a base material or the like that adheres directly to the wiring body 4B to support it is not necessary.

The above embodiments heretofore explained are described to facilitate understanding of the present invention and are not described to limit the present invention. It is therefore intended that the elements disclosed in the above embodiments include all design changes and equivalents to fall within the technical scope of the present invention.

For example, in the above-described embodiments, the conductor-layer-equipped structure 2 includes: the first adhesion layer 101 which is interposed between the wiring body 4 and the cover glass 31 and makes the wiring body 4 adhere to the cover glass 31; and the second adhesion layer 102 which is interposed between the wiring body 4 and the liquid crystal panel 32 and makes the wiring body 4 adhere to the liquid crystal panel 32, but the present invention is not particularly limited to the above. For example, the first adhesion layer 101 may be omitted, and the main surface 311 of the cover glass 31 and the main surface 41 of the wiring body 4 may be merely in direct contact with each other so that the cover glass 31 does not adhere to the wiring body 4. In addition or alternatively, the second adhesion layer 102 may be omitted, and the main surface 321 of the liquid crystal panel 32 and the main surface 42 of the wiring body 4 may be merely in direct contact with each other so that the liquid crystal panel 32 does not adhere to the wiring body 4.

For example, in the above-described embodiments, a metal material or a carbon-based material is used as the conductive powder which constitutes the first and second conductor layers, but the present invention is not particularly limited to this, and a mixture of a metal material and a carbon-based material may also be used. In this case, in an example of the first conductor line 62, for example, the carbon-based material may be disposed at the top surface 64 side of the first conductor line 62 and the metal-based material may be disposed at the contact surface 63 side. Conversely, the metal-based material may be disposed at the top surface 64 side of the first conductor line 62 and the carbon-based material may be disposed at the contact surface 63 side.

The wiring body 4 of one or more embodiments includes two conductor layers 6 and 8, but the present invention is not particularly limited to this, and the wiring body 4 may include only the first conductor layer 6. The second resin layer in this example corresponds to an example of the "second resin layer."

In the above-described embodiments, the conductor-layer-equipped structure has been described as being used in an input device, but the use of the conductor-layer-equipped structure is not particularly limited to this. For example, the conductor-layer-equipped structure may be used as a heater by flowing current through the wiring body to generate heat, such as by resistance heating. In this case, a carbon-based material having a relatively high electric resistance value as the conductive powder which constitutes the conductor layer may be used. In one or more embodiments, the conductor-layer-equipped structure may be used as an electromagnetic shield by grounding a part of the conductor part of the wiring body. In one or more embodiments, the conductor-layer-equipped structure may be used as an antenna. The conductor-layer-equipped structure of one or more embodiments of the present invention can be applied to various structures if the structures need transparency (translucency), and the conductor-layer-equipped structure can be used, for example, in a simple switch and the like. In such cases, an object in which the wiring body is equipped corresponds to an example of the "support body" of the one or more embodiments of the present invention, and the heater, electromagnetic shield, and antenna each including the wiring body and the support body correspond to an example of the "conductor-layer-equipped structure."

| [Description of Reference Numerals] | |
| --- | --- |
| 1 | Input device |
| 2 | Conductor-layer-equipped structure |
| 31 | Cover glass |
| 311 | Main surface |
| 312 | Positioning pin |
| 32 | Liquid crystal panel |
| 321 | Main surface |
| 4 | Wiring body |
| 41, 42 | Main surface |
| 5 | First resin layer |
| 51 | Flat part |
| 52 | Support part |
| 6 | First conductor layer |
| 61 | First mesh-like electrode layer |
| 62a, 62b | First conductor line |

| | [Description of Reference Numerals] |
|---|---|
| 63 | Contact surface |
| 64 | Top surface |
| 641 | Flat part |
| 65 | Side surface |
| 651 | First portion |
| 652 | Second portion |
| 653 | Flat part |
| 66 | Lead wires |
| 67 | Lead part |
| 7 | Second resin layer |
| 71 | Main part |
| 72 | Support part |
| 8 | Second conductor layer |
| 81 | Second mesh-like electrode layer |
| 82a, 82b | Second conductor line |
| 83 | Contact surface |
| 84 | Top surface |
| 841 | Flat part |
| 85 | Side surface |
| 851 | First portion |
| 852 | Second portion |
| 853 | Flat part |
| 86 | Lead wires |
| 87 | Lead part |
| 9 | Third resin layer |
| 101 | First adhesion layer |
| 102 | Second adhesion layer |
| 11 | Recessed plate |
| 111 | Recess |
| 12 | Conductive material |
| 121 | Surface |
| 13 | Resin material |
| 14 | Support base material |
| 15 | First intermediate body |
| 16 | Recessed plate |
| 161 | Recess |
| 17 | Conductive material |
| 171 | Surface |
| 18 | Resin material |
| 19 | Second intermediate body |
| 20 | Resin material |
| 21 | Adhesive material |
| 22 | Adhesive material |

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

The invention claimed is:

1. A conductor-layer-equipped structure comprising:
a wiring body including:
a first resin layer,
a first conductor layer provided on the first resin layer, and
a second resin layer provided on the first resin layer so as to cover the first conductor layer and to directly contact the first conductor layer and the first resin layer;
a support body in direct contact with one main surface of the wiring body or that adheres to the one main surface of the wiring body via a first adhesion layer; and
a board in direct contact with another main surface of the wiring body or that adheres to the other main surface of the wiring body via a second adhesion layer, wherein
the first resin layer is composed of a material having optical isotropy,
the second resin layer is composed of a material having optical isotropy,
the material of which the first resin layer is composed and the material of which the second resin layer is composed have the same composition, and
following Expressions (1) and (2) are satisfied:

$$1.45 \leq N_1 \leq 1.55 \quad (1)$$

$$1.45 \leq N_2 \leq 1.55 \quad (2)$$

where $N_1$ represents a refractive index of the material of which the first resin layer is composed and $N_2$ represents a refractive index of the material of which the second resin layer is composed.

2. A conductor-layer-equipped structure comprising:
a wiring body including:
a first resin layer,
a first conductor layer provided on the first resin layer, and
a second resin layer provided on the first resin layer so as to cover the first conductor layer and to directly contact the first conductor layer and the first resin layer; and
a support body in direct contact with one main surface of the wiring body or that adheres to the one main surface of the wiring body via a first adhesion layer, wherein
another main surface of the wiring body is an external surface of the conductor-layer-equipped structure,
the first resin layer is composed of a material having optical isotropy,
the second resin layer is composed of a material having optical isotropy,
the material of which the first resin layer is composed and the material of which the second resin layer is composed have the same composition, and
following Expressions (1) and (2) are satisfied:

$$1.45 \leq N_1 \leq 1.55 \quad (1)$$

$$1.45 \leq N_2 \leq 1.55 \quad (2)$$

where $N_1$ represents a refractive index of the material of which the first resin layer is composed and $N_2$ represents a refractive index of the material of which the second resin layer is composed.

3. The conductor-layer-equipped structure according to claim 1, wherein
following Expressions (3) and (4) are satisfied:

$$97\% \leq T_1 \quad (3)$$

$$97\% \leq T_2 \quad (4)$$

where $T_1$ represents a total light transmittance of the material of which the first resin layer is composed and $T_2$ represents a total light transmittance of the material of which the second resin layer is composed.

4. The conductor-layer-equipped structure according to claim 1, wherein
a following Expression (5) is satisfied:

$$0.1\ \mu m \leq H_1 \leq 50\ \mu m \quad (5)$$

where $H_1$ represents a height of the first resin layer.

5. The conductor-layer-equipped structure according to claim 1, wherein
the first conductor layer is composed of a first conductor line,
the first conductor line includes:
a first surface that is located at the first resin layer side;
a second surface that faces the first surface; and two side surfaces that incline so as to come close to each other in a transverse cross-section of the first conductor line as departing from the first resin layer, and a surface roughness of the first surface is rougher than a surface roughness of the second surface.

6. The conductor-layer-equipped structure according to claim 1, wherein the wiring body further includes a second conductor layer provided on the second resin layer so as to face the first conductor layer via the second resin layer.

7. The conductor-layer-equipped structure according to claim 6, wherein

Expression (6) is satisfied:

$$H_2 > H_1 \qquad (6)$$

where $H_1$ represents a height of the first resin layer and $H_2$ represents a height of the second resin layer.

8. The conductor-layer-equipped structure according to claim 6, wherein the wiring body further comprises a third resin layer provided on the second resin layer so as to cover the second conductor layer, and a material of which the third resin layer is composed has the same composition as compositions of the materials of which the first and second resin layers are composed.

9. The conductor-layer-equipped structure according to claim 1, wherein the first adhesion layer is located at the second resin layer side with respect to the first resin layer.

10. A touch panel comprising the conductor-layer-equipped structure according to claim 1.

11. The conductor-layer-equipped structure according to claim 2, wherein following Expressions (3) and (4) are satisfied:

$$97\% \leq T_1 \qquad (3)$$

$$97\% \leq T_2 \qquad (4)$$

where $T_1$ represents a total light transmittance of the material of which the first resin layer is composed and $T_2$ represents a total light transmittance of the material of which the second resin layer is composed.

12. The conductor-layer-equipped structure according to claim 2, wherein following Expression (5) is satisfied:

$$0.1\ \mu m \leq H_1 \leq 50\ \mu m \qquad (5)$$

where $H_1$ represents a height of the first resin layer.

13. The conductor-layer-equipped structure according to claim 2, wherein the first conductor layer is composed of a first conductor line, the first conductor line includes:

a first surface that is located at the first resin layer side;

a second surface that faces the first surface; and two side surfaces that incline so as to come close to each other in a transverse cross-section of the first conductor line as departing from the first resin layer, and a surface roughness of the first surface is rougher than a surface roughness of the second surface.

14. The conductor-layer-equipped structure according to claim 2, wherein the wiring body further includes a second conductor layer provided on the second resin layer so as to face the first conductor layer via the second resin layer.

15. The conductor-layer-equipped structure according to claim 14, wherein a following Expression (6) is satisfied:

$$H_2 > H_1 \qquad (6)$$

where $H_1$ represents a height of the first resin layer and $H_2$ represents a height of the second resin layer.

16. The conductor-layer-equipped structure according to claim 14, wherein the wiring body further includes a third resin layer provided on the second resin layer so as to cover the second conductor layer, and a material of which the third resin layer is composed has the same composition as compositions of the materials of which the first and second resin layers are composed.

17. The conductor-layer-equipped structure according to claim 2, wherein the first adhesion layer is located at the second resin layer side with respect to the first resin layer.

18. A touch panel comprising the conductor-layer-equipped structure according to claim 2.

* * * * *